United States Patent
Iwamoto

(10) Patent No.: US 6,489,823 B2
(45) Date of Patent: Dec. 3, 2002

(54) SEMICONDUCTOR DEVICE CAPABLE OF GENERATING HIGHLY PRECISE INTERNAL CLOCK

(75) Inventor: Hisashi Iwamoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/809,298

(22) Filed: Mar. 16, 2001

(65) Prior Publication Data
US 2002/0043996 A1 Apr. 18, 2002

(30) Foreign Application Priority Data
Oct. 18, 2000 (JP) .......................................... 2000-317513

(51) Int. Cl.[7] ................................................. H03L 7/06
(52) U.S. Cl. ...................... 327/158; 327/161; 327/163; 327/276; 327/277; 331/17; 331/25
(58) Field of Search ................................. 327/276, 277, 327/278, 285, 288, 158, 161, 163, 149, 156; 331/17, 25, DIG. 2; 375/375, 376

(56) References Cited

U.S. PATENT DOCUMENTS 5,910,740 A * 6/1999 Underwood ................. 327/149
5,990,714 A * 11/1999 Takahashi .................... 327/149
6,157,229 A * 12/2000 Yoshikawa ................... 327/149
6,292,040 B1 * 9/2001 Iwamoto et al. ............. 327/158

FOREIGN PATENT DOCUMENTS

JP          11-7768          1/1999

* cited by examiner

Primary Examiner—Timothy P. Callahan
Assistant Examiner—An T. Luu
(74) Attorney, Agent, or Firm—McDermott, Will & Emery

(57) ABSTRACT

A DLL circuit includes a delay line having a configuration with delay stages receiving alternate complementary clock signals ECK and /ECK having an adjusted phase difference therebetween. A capacitor can be used to adjust the phase difference between signals ECK and /ECK to allow the delay line to provide an amount of delay varying minutely. Preferably, for a fast clock, delay adjustment starts with a shift register having an initial value providing an intermediate amount of delay, and for a slow clock, delay adjustment starts with the shift register having an initial value providing a minimal amount of delay. There can be provided a semiconductor device provided with a DLL circuit accommodating a fast clock with reduced jitter.

10 Claims, 20 Drawing Sheets

SEMICONDUCTOR DEVICE CAPABLE OF GENERATING HIGHLY PRECISE INTERNAL CLOCK

BACKGROUND OF THE INVENTION

1. Field of the Invention

The present invention relates generally to semiconductor devices, and particularly to a synchronous semiconductor device taking in a signal in synchronization with an externally applied clock signal. More specifically, the present invention relates to an internal clock generation circuit in a synchronous dynamic random access memory (hereinafter referred to as an SDRAM) employing a delay-locked loop (hereinafter referred to as DLL) for an internal clock circuit.

2. Description of the Background Art

Dynamic random access memory (DRAM) used as main memory has been increased in speed. However, its operating speed still cannot catch up to that of microprocessors (MPUs). Thus it is often said that the DRAM's access time and cycle time become a bottleneck and the entire system is degraded in performance. In recent years, an SDRAM operating in synchronization with a clock signal is increasingly used as the main memory for a rapid MPU.

The SDRAM, synchronized with an external clock signal to takes in an external signal and data in a synchronous operation, is advantageous in that its data input/output time requires a smaller margin than conventional memory, which requires a margin for its data input/output time to consider a skewed (offset in timing) address signal.

As such, if as in an SDRAM an address signal and a data signal are synchronized by a clock signal and successive data can also be written and read, and shorter successive access times can be achieved.

As an MPU operates more and more rapidly, as has been described above, providing a more rapid internal clock signal for use internal to an SDRAM is an unavoidable issue in terms of the performance of the entire system as well as other aspects, since if an internal clock signal is slow an access time from a clock governs an operating frequency. As such, an SDRAM can have a delay-locked loop (DLL) receiving an external clock signal CLK and generating an internal clock signal ICLK synchronized with clock signal CLK.

FIG. 24 is a block diagram showing a configuration of a conventional DLL.

As shown in FIG. 24, an external clock signal CLK is fed to a clock buffer 502 which in turn outputs a signal ECLK. Signal CLK is fed to a DLL510. DLL510 changes a phase of signal ECLK and outputs internal clock signal ICLK which is sent to an input/output buffer (not shown) receiving an address signal, a data signal and the like and serves as a clock for use in taking in an externally applied signal. Since internal clock signal ICLK can have its phase changed to be different than external clock signal CLK, for example a data signal can be timed differently in outputting data from the input/output buffer. If internal clock signal ICLK phase is set ahead of external clock signal CLK phase, a shorter access time can be achieved.

DLL510 is of digital type. A DLL of digital type is considered suitable since in an SDRAM, which would suffer large power-supply noise, a DLL of analog type would result in large jitter or fluctuation attributed to the noise.

DLL510 includes a delay line 522 delaying signal ECLK received from the clock buffer and outputting internal clock signal ICLK, a delay circuit 526 delaying internal clock signal ICLK for a period of time corresponding to a delay time to an internal circuit where internal clock signal ICLK is used, a phase comparator 528 comparing a phase of a signal RCLK output from delay circuit 526 and that of signal CLK with each other and outputting control signals UP and DOWN, and a shift register 524 responsive to an output from phase comparator 528 for controlling a delay time of delay line 522. This DLL is a type of automatic control circuit.

When phase comparator 528 receives signals CLK and RCLK, phase comparator 528 compares the phases of the signals and outputs control signals UP and DOWN. When signals CLK and RCLK substantially match in phase, synchronization is established. The establishment of synchronization is generally referred to a DLL in locked state. Shift register 524 changes the delay time of the delay line in response to control signals UP and DOWN.

FIG. 25 is a circuit diagram showing one example of a configuration of delay line 522 shown in FIG. 24.

As shown in FIG. 25, a shift register 524 feeds control signals C(1) to C(n) to delay line 522.

Delay line 522 includes an NAND circuit 544#1 receiving signal ECLK and control signal C(1), an NAND circuit 546#1 having one input fixed to have a power supply potential VDD and the other input receiving an output of NAND circuit 544#1, an inverter 547#1 receiving and inverting an output of NAND circuit 541#1, an NAND circuit 544#2 receiving signals CLK and control signal C(2), an NAND circuit 546#2 receiving an output of NAND circuit 544#2 and an output of inverter 547#1, and an inverter 547#2 receiving and inverting an output of NAND circuit 546#2.

Delay line 522 also includes an NAND circuit 544#n−1 receiving signal ECLK and control signal C (n−1), an NAND circuit 546#n−1 receiving an output of inverter 547#n−2 (not shown) and an output of NAND circuit 544#n−1, an inverter 547#n−1 receiving and inverting an output of NAND circuit 546#n−1, an NAND circuit 544#n receiving signal ECLK and control signal C(n), an NAND circuit 546#n receiving an output of NAND circuit 544#n and an output of inverter 547#n−1, and an inverter 547#n receiving and inverting an output of NAND circuit 546#n and outputting internal clock signal ICLK.

Shift register 524 outputs control signals C(1) to C(n), of which only one signal is set high and the remaining signals are set low. For example, if control signal C(n−1) is driven high then signal ECLK is transmitted via NAND circuit 544#n−1 and internal clock signal ICLK is responsively output. If a delay time is too long then the high level is output via a control signal shifted rightward in position and if a delay time is too short then the high level is output via a control signal shifted leftward in position. Thus a delay time is adjusted. In general, in powering on an SDRAM a minimal delay time is initially applied. As such, in FIG. 25, control signal C(n) is set high and via NAND circuit 544#n signal ECLK is taken into the delay line.

If such a delay line is used, however, a delay time varies in a step corresponding to the sum-of a delay time of an NAND circuit and that of an inverter. For a high operating frequency, a conventional delay line, having a delay time varying in too large a step, can disadvantageously provide the delay time varying stepwise, resulting in no operating margin.

Furthermore, for a high operating frequency, locking a DLL requires a delay time shorter than the minimal delay. As such, the internal clock signal is limited in having high rate.

SUMMARY OF THE INVENTION

The present invention contemplates a semiconductor device incorporating an internal clock signal generation circuit allowing a delay time to vary in a small step to accommodate a clock signal of a high operating frequency.

The present invention provides a semiconductor device including a clock generation circuit and an internal circuit.

The internal clock signal generation circuit generates an operating clock signal in response to an external clock signal.

The internal clock generation circuit includes a phase comparator comparing a phase of the external clock signal and a phase of the operating clock signal with each other and a clock delay portion responsive to an output of the phase comparator for delaying a first internal clock signal to output an operating clock.

The clock delay portion has a clock conversion portion generating from the first internal clock signal a second internal signal and a third internal signal complementary to the second internal signal, and a clock output portion responsive to an output of the phase comparator for changing by one stage a number of gate stage(s) to be passed through.

For an odd number of gate stage(s) to be passed through, the clock output portion outputs the operating clock in response to the second internal clock signal. For an even number of gate stages to be passed through, the clock output portion outputs the operating clock signal in response to the third internal clock signal.

The internal circuit operates in response to the operating clock signal.

The present invention in another aspect provides a semiconductor device including an internal clock generation circuit and an internal circuit.

The internal clock generation circuit generates an operating clock signal in response to an external clock signal. The internal clock generation circuit includes a phase comparator comparing a phase of the external clock signal and a phase of the operating clock signal with each other and a clock delay portion responding to a reset signal to set an initial value of a delay time and responding to an output of the phase comparator to alter a delay time to delay a first internal clock signal for a delay time to output the operating clock.

The clock delay portion has a setting switch portion switching the initial value between a first value and a second value allowing a longer delay time than the first value, and a clock output portion receiving the initial value from the setting switch portion and responding to an output of the phase comparator to alter a delay time to output the operating clock signal corresponding to the first internal clock signal delayed.

The internal circuit operates in response to the operating clock signal.

The present invention in still another aspect provides a semiconductor device including an internal clock generation circuit and an internal circuit.

The internal clock generation circuit generates an operating clock signal in response to an external clock signal. The internal clock generation circuit includes a phase comparator, first and second clock delay portions and a control portion.

The phase comparator compares a phase of the external clock signal and a phase of the operating clock signal with each other. The first clock delay portion delays a first internal clock signal for a first delay time determined in response to an output of the phase comparator. The second clock delay portion delays an output of the first clock delay portion for a second delay time determined in response to an output of the phase comparator in a coarser step than the first delay time to output the operating clock. Once the operating clock is stabilized, the control portion instructs the second clock-delay portion to fix the second delay time regardless of any output of the phase comparator.

The internal circuit operates in response to the operating clock.

Thus a main advantage of the present invention is that a delay line can provide a delay time adjusted in a step more minutely than conventional and jitter can thus be significantly reduced if a fast clock signal is input.

Another advantage of the present invention is that if a high clock frequency is applied an appropriate internal clock can be generated to provide a wide range of clock frequency allowing operation.

Still another advantage of the present invention is that jitter of an internal clock in steady state can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the drawings:

FIG. 8 is a signal waveform diagram representing a relationship between control signals DOWN and UP output from phase comparator 28 and a control signal C output from shift register 24a;

DESCRIPTION OF THE PREFERRED EMBODIMENTS

Figure 1:
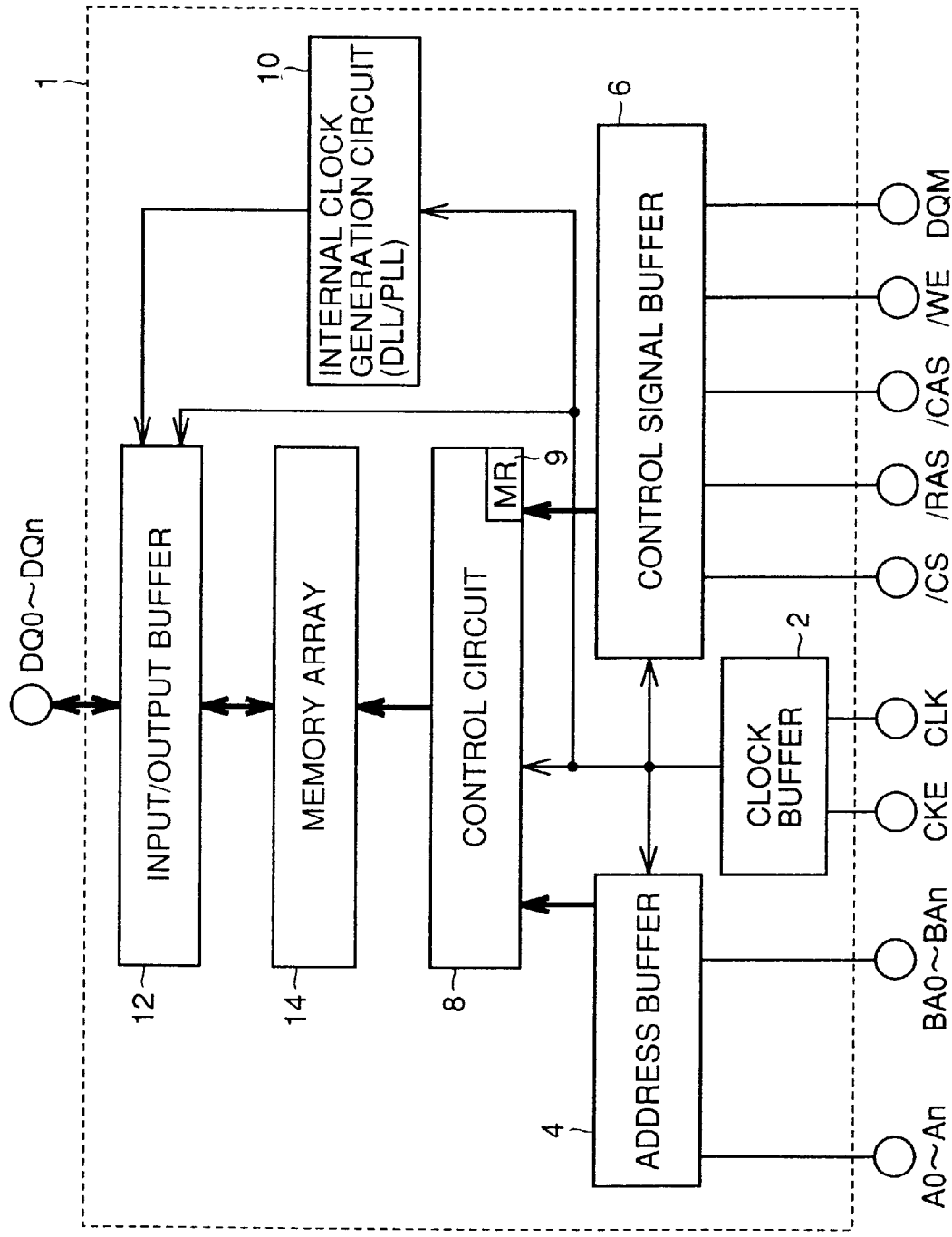
FIG. 1 is a block diagram showing a schematic configuration of a semiconductor device 1 in a first embodiment of the present invention.

Hereinafter the embodiments of the present invention will be described in detail with reference to the drawings. Note that in the figures, like reference characters denote like elements.

FIRST EMBODIMENT

FIG. 1 is a block diagram showing a schematic configuration of a semiconductor device 1 in a first embodiment of the present invention.

As shown in FIG. 1, semiconductor device 1 is shown as exemplary, synchronous dynamic random access memory (SDRAM) synchronized with a clock signal to communicate data. Semiconductor 1 includes a clock buffer 2 receiving an external clock signal CLK and a clock enable signal CKE, an address buffer 4 receiving address signals A0–An (n is a natural number) and bank address signals BA0–BAn, and a control signal buffer 6 receiving control signals /CS, /RAS, /CAS, /WE, DQM. Address buffer 4 and the control buffer are synchronized with an output of clock buffer 2 to take in an address signal, a control signal and the like.

Semiconductor device 1 also includes an internal clock generation circuit 10 generating an internal clock signal in response to an output of clock buffer 2, a control circuit 8 synchronized with an output of clock buffer 2 to receive an output of address buffer 4 and an output of control signal buffer 6, a memory array 14 controlled by control circuit 8 to transmit and receive data signals DQ0–DQn, and an input/output buffer 12 synchronized with an output of internal clock generation circuit 10 or an output of clock buffer 2 to receive and transmit external data to memory array 14 and receive data from memory array 14 and externally output the same.

Control circuit 8 includes a mode register 9, which, as will be described hereinafter, responds to a mode register set command provided by a combination of control signals, to maintain a mode of operation designated by an address signal currently applied.

Internal clock generation circuit 10 includes a delay-locked loop (DLL) or a phase-locked loop (PLL).

Figure 2:
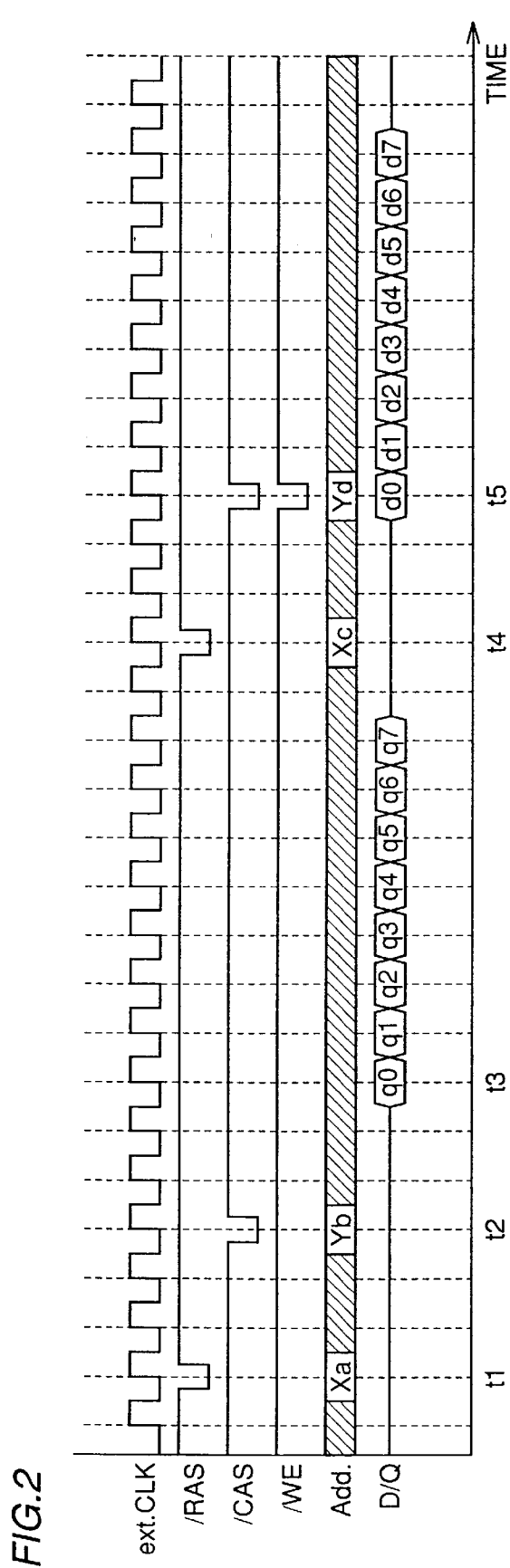
FIG. 2 is a waveform diagram for illustrating a standard timing allowing semiconductor device 1 to be accessed successively.

FIG. 2 is a waveform diagram for illustrating a standard timing satisfying a specification allowing semiconductor device 1 to be accessed successively.

In FIG. 2, an SDRAM capable of inputting and outputting 8-bit data (byte data) through data input/output terminals DQ0–DQ7, operates to write or read eight successive data (a total of 8×8=64 bits). A number of bits of data successively read is referred to as a burst length and for SDRAMs it can generally be changed depending on setting a mode register.

With reference to FIG. 2, at time t1 an external clock signal ext.CLK (a system clock for example) is applied as the FIG. 1 clock signal CLK and when it transitions from low to high an external control signal (a row address strobe signal /RAS, a column address strobe signal /CAS, an address signal ADD and the like) are taken in. Since row address strobe signal /RAS has an active state or a low level, address signal ADD. is taken in as a row address Xa. Note that address signal ADD. is applied as a combination of the FIG. 1 address signals A0–An and bank address signals BA0–BAn.

At time t2, column address strobe signal ICAS attains an active state or a low level and it is internally taken in in synchronization with a low to high transition of clock signal ext.CLK, when address signal ADD is taken in as a column address Yb. In response to row and column addresses Xa and Yb taken in, row and column select operation is performed in the SDRAM.

D/Q denotes a data signal input/output through input/output terminal DQi. When row address strobe signal /RAS transitions from high to low and a predetermined clock period (six clock cycles in FIG. 2) has then elapsed, i.e., at time t3, first data q0 is output and following data q0 data q1–q7 are output successively. The data are output in response to clock signal ext.CLK transitioning from high to low.

From time t4 onwards, a write operation is represented. At time t4, a row address Xc is taken in. At time t5, if column address strobe signal /CAS and write enable signal /WE are both active in state or low in level then in response to clock signal ext.CLK transitioning from low to high a column address Yd is taken in and the data currently supplied, data d0, is also taken in as first data to be written. In response to row and column address strobe signals /RAS and /CAS transitioning from high to low a row and column select operation is performed in the SDARM. Thereafter, in synchronization with clock signal ext.CLK input data d1–d7 are successively taken in and written in a corresponding memory cell.

Figure 3:
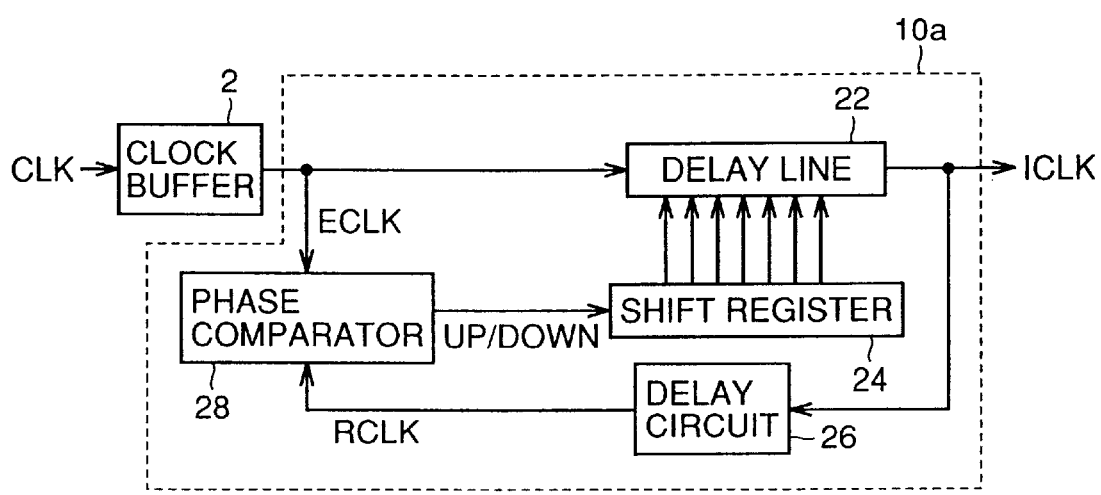
FIG. 3 is a block diagram showing a configuration of a DLL circuit 10a used as an internal clock generation circuit 10 shown in FIG. 1.

FIG. 3 is a block diagram showing a configuration of a DLL circuit 10a used as the FIG. 1 internal clock generation circuit 10.

Note that clock buffer 2 having received external clock signal CLK is shown for sake of convenience for illustration.

As shown in FIG. 3, DLL circuit 10a includes a delay line 22 delaying a signal output from clock buffer 2 or signal ECLK and outputting internal clock signal ICLK, a delay circuit 26 delaying an output of delay line 22 for a period of time corresponding to a delay time elapsing until internal clock ICLK is transmitted an internal circuit (not shown) to which internal clock signal ICLK is applied, a phase comparator 28 comparing a phase of a signal RCLK received from delay circuit 26 with signal ECLK to output control signals UP and DOWN, and a shift register 24 responsive to an output of phase comparator 28 for controlling a delay time of delay line 22.

Figure 4:
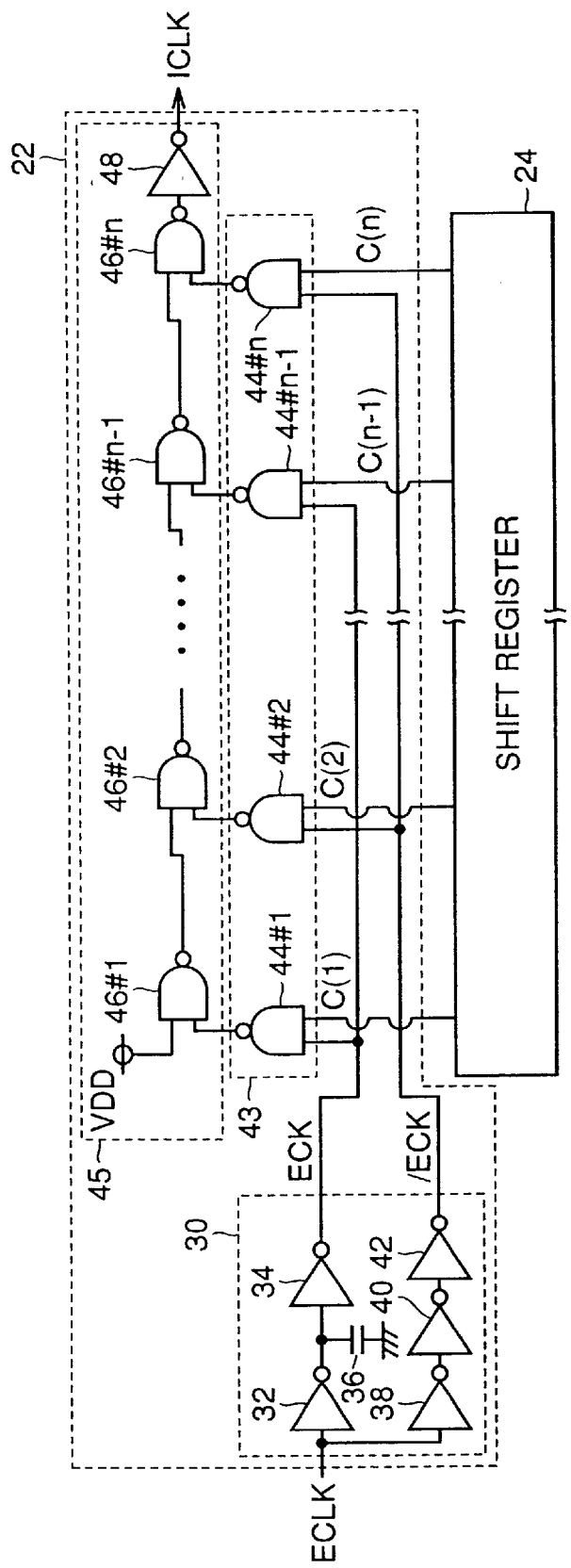
FIG. 4 is a circuit diagram showing a configuration of a delay line 22 shown in FIG. 3.

FIG. 4 is a circuit diagram showing a configuration of delay line 22 of FIG. 3.

As shown in FIG. 4, delay line includes a clock conversion portion receiving signal ECLK and outputting complementary signals ECK and /ECK, an NAND circuit 44#1 receiving control signal C(1) and signal ECK, an NAND circuit 46#1 having one input fixed to a power supply potential VDD and the other input receiving an output of NAND circuit 44#1, an NAND circuit 44#2 receiving control signal C(2) and signal /ECK, an NAND circuit 46#2 receiving outputs of NAND circuits 46#1 and 44#2, an NAND circuit 44#n−1 receiving control signal C (n−1) and signal ECK, an NAND circuit 46#n−1 receiving outputs of NAND circuits 46#n−2 (not shown) and 44#n−1, an NAND circuit 44#n receiving control signal C(n) and signal /ECK, an NAND circuit 46#n receiving outputs of NAND circuits 46#n−1 and 44#n, and an inverter 48 receiving and inverting an output of NAND circuit 46#n and outputting internal clock signal ICLK.

NAND circuits 44#1 to 44#n configure a selector 43 selecting a route for transmitting signal ECLK. Furthermore, NAND circuits 46#1 to 46#n configure a clock output circuit 45 receiving signal ECK or /ECK at an input portion of a route selected by selector 43, and outputting internal clock signal ICLK. The NAND circuits in clock output circuit 45 each correspond to one stage serving as a minimal unit for delay adjustment and changing the position of the input node can change the number of gate stages of NAND circuits connected in series from the input node to the output node. It should he noted however that changing the number of gate stages by one results in an output signal having its polarity inverted and to latch the polarity either signal CK or /CK is received as appropriate.

A clock conversion unit 30 includes inverters 32 and 34 connected in series receiving signal ECLK, and a capacitor 36 connected between a node connecting inverters 32 and 34 together and a ground node. Inverter 34 outputs signal ECK.

Clock conversion portion 30 also includes inverters 38, 40, 42 connected in series receiving signal CLK and outputting signal /CK.

Figure 25:
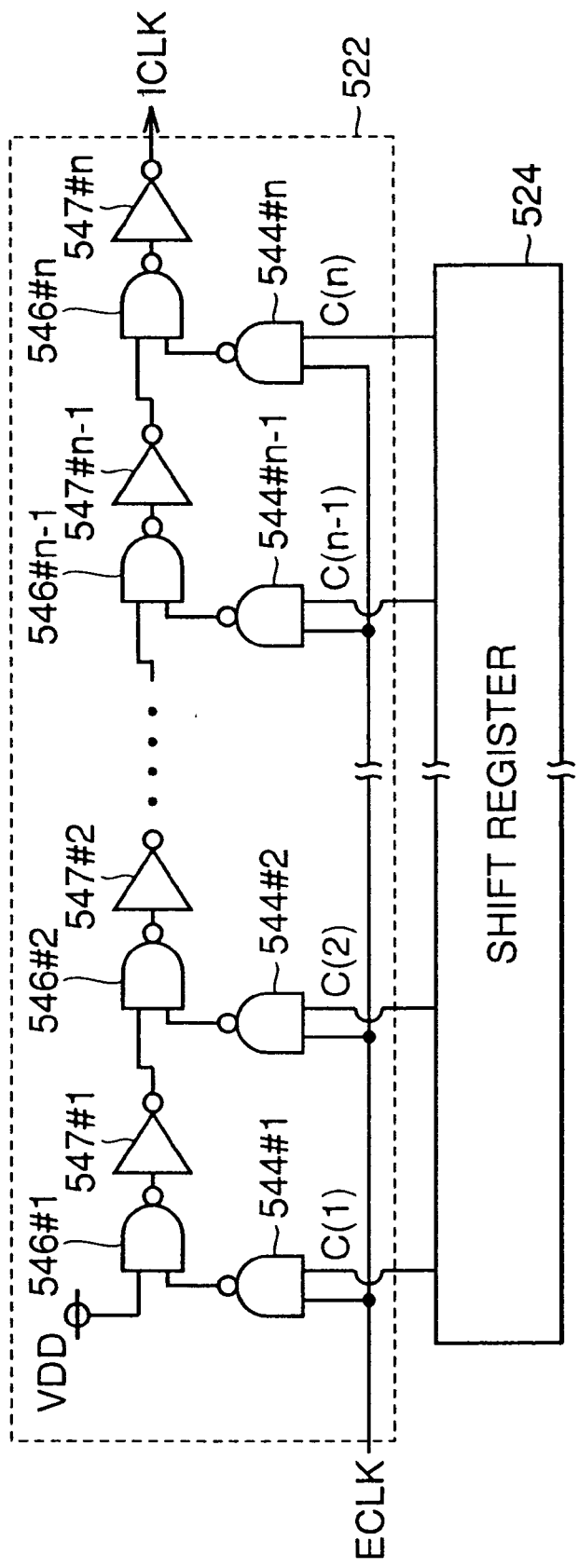
FIG. 25 is a circuit diagram showing one example of a configuration of a delay line 522 shown in FIG. 24.

Delay line 22 is distinguished from the FIG. 25 conventional delay line 522, as follows: in delay line 22, clock conversion portion 33 converts signal CLK to complementary signals ECK and /ECK, which signals have therebetween a phase difference adjusted by capacitor 36.

In the conventional delay line 522, to prevent a polarity from being inverted a single NAND circuit stage and single inverter stage are provided as one set to change by two at a time the number of gate stages of a route passing a signal. In delay line 22, in contrast, an NAND-circuit stage count varies by one at a time. Reducing in the delay line the amount in time of a variation for one step can decrease jitter of the DLL circuit and thus improve performance. It should be noted, however, that for a signal to have its polarity matched the delay line has a first stage receiving signal ECK and a second stage receiving complementary signal /ECK. Successively, odd stages receive signal ECK and even stages receive signal /ECK. Complementary signals ECK and /ECK have their respective edges timed to substantially match each other as capacitor 36 has its capacitance adjusted to eliminate a delay-time difference corresponding to one inverter stage.

More specifically, capacitor 36 is used to adjust signal /ECK to have a waveform falling when signal ECK has a rising waveform, and signal /ECK to have a waveform rising when signal CK has a falling waveform. The capacitor may be dispensed with and alternatively an inverter size may be changed in ratio or a resistor may be inserted to adjust the signals.

For example, if NAND circuit 44#n receives a signal then from signal ECLK to internal clock signal ECLK there exist six stages of inverters 38, 40 and 42, NAND circuits 44#n and 46#n, and inverter 48. Herein, if the shift register operates to increase a delay time by one stage the NAND circuit transmitting a signal is switched from 44#n to 44#n−1.

As such from signal ECLK through internal clock signal ICLK output there exist six stages of inverters 32 and 34, NAND circuits 44#n−1, 46#n−1 and 46#n and inverter 48. If signals ECK and /ECK have therebetween a phase difference adjusted by capacitor 36, however, between signal ECLK and internal clock signal ICLK there can be provided a delay time corresponding to seven stages. Thus, capacitor 36 adjusting a phase difference allows delay line 22 to provide a total of delay time varying in a step corresponding to one NAND-circuit stage at a time.

Figure 5:
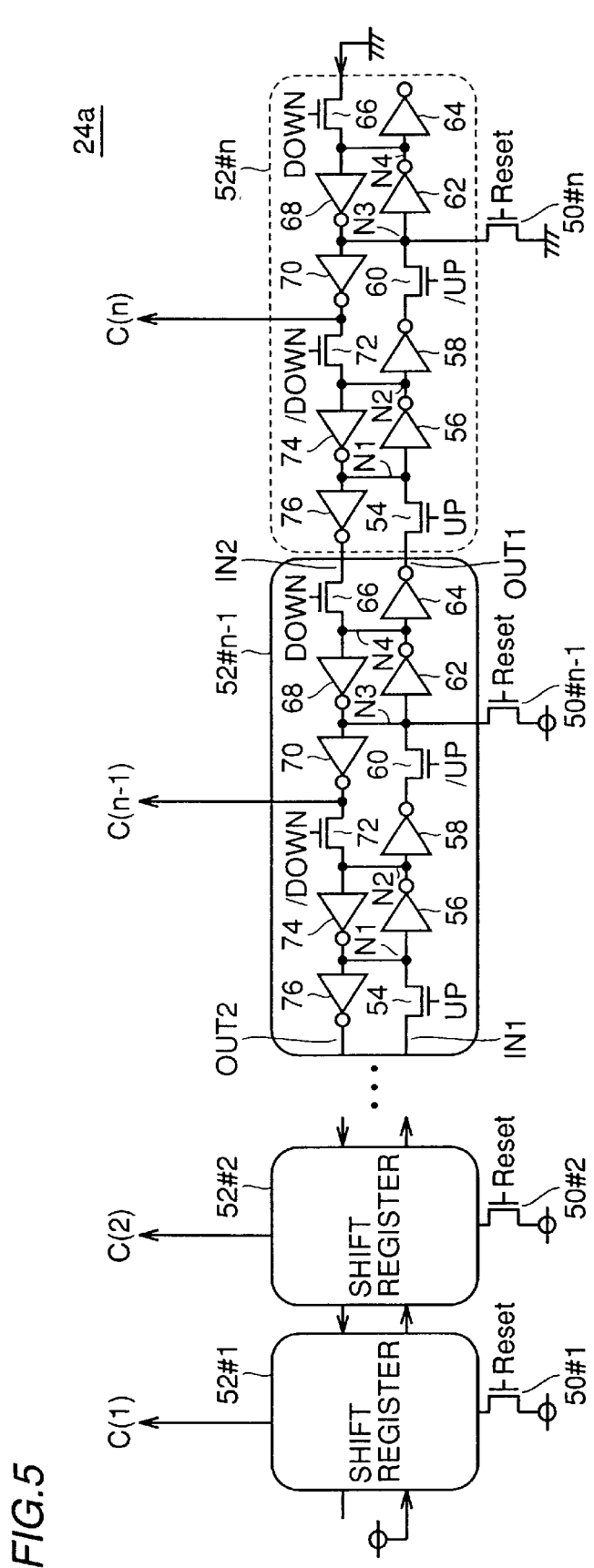
FIG. 5 is a circuit diagram showing a configuration of a shift register 24a, one example of a shift register 24 shown in FIG. 3.

FIG. 5 is a circuit diagram showing a configuration of a shift register 24a, one example of shift register 24 of FIG. 3.

As shown in FIG. 5, shift register 24a includes shift registers 52#1 52#n outputting control signals C(1)–C(n), respectively, and N-channel MOS transistors 50#1–50#n providing a level of potential for initializing shift registers 52#1–52#n.

Shift register 52#n−1 includes an N-channel MOS transistor 54 connected between an input node IN1 and a node N1 and having its gate receiving control signal UP, an inverter 56 having an input connected to node N1 and an output connected to a node N2, and an inverter 58 having an input connected to node N2.

Shift register 50#n−1 also includes an N-channel MOS transistor 60 connected between an output of inverter 58 and a node N3 and having its gate receiving a control signal /UP, an inverter 62 having an input connected to node N3 and an output connected to a node N4, and an inverter 64 having an input connected to node N4 and an output connected to a node OUT1.

Shift register 52#n−1 also includes an N-channel MOS transistor 66 connected between a node IN2 and node N4 and having its gate receiving control signal DOWN, an inverter 68 having an input connected to node N4 and an output connected to node N3, an inverter 70 having an input connected to node N3, and outputting control signal C(n−1), an N-channel MOS transistor 72 connected between inverter 70 and output node N2 and having its gate receiving a control signal /DOWN, an inverter 74 having an input connected to node N2 and an output connected to node N1, and an inverter 76 having an input connected to node Ni and an output connected to a node OUT2. Note that control signals /UP and /DOWN are inverted versions of control signals UP and DOWN, respectively, and they may be generated with a shift register by means of an inverter or they may be generated via an inverter provided in an output portion of a phase comparator.

The remaining shift registers 52#1–52#n are similar in configuration to shift register 52#n−1 and they will thus not be described in detail.

Shift register 52#1 serving as an initial stage has its input node IN1 connected to a power supply node and its output node OUT1 connected to input node IN1 of shift register 52#2. Furthermore, shift register 52#2 has its output node OUT2 connected to input node IN2 of shift register 52#1.

Shift register 52#n serving as a final stage has its input node IN2 connected to a ground node and its output node OUT2 connected to input node IN2 of shift register 52#n−1. Shift register 52#n−1 has its output node OUT1 connected to input node IN1 of shift register 52#n.

Upon power-on, a reset signal Reset is set high and thereafter it is cleared. As such, shift register 52#n has its node N3 set low and control signal C(n) responsively goes high, while the other shift registers have their respective nodes N3 receiving a high level signal via N-channel MOS transistors 50#1 to 50#n−1 and control signals C(1) to C(n−1) are responsively driven low.

Thereafter for control signal DOWN activated control signal C is activated at a position shifted leftward and for control signal UP activated control signal C is activated at a position shifted rightward.

Figure 6:
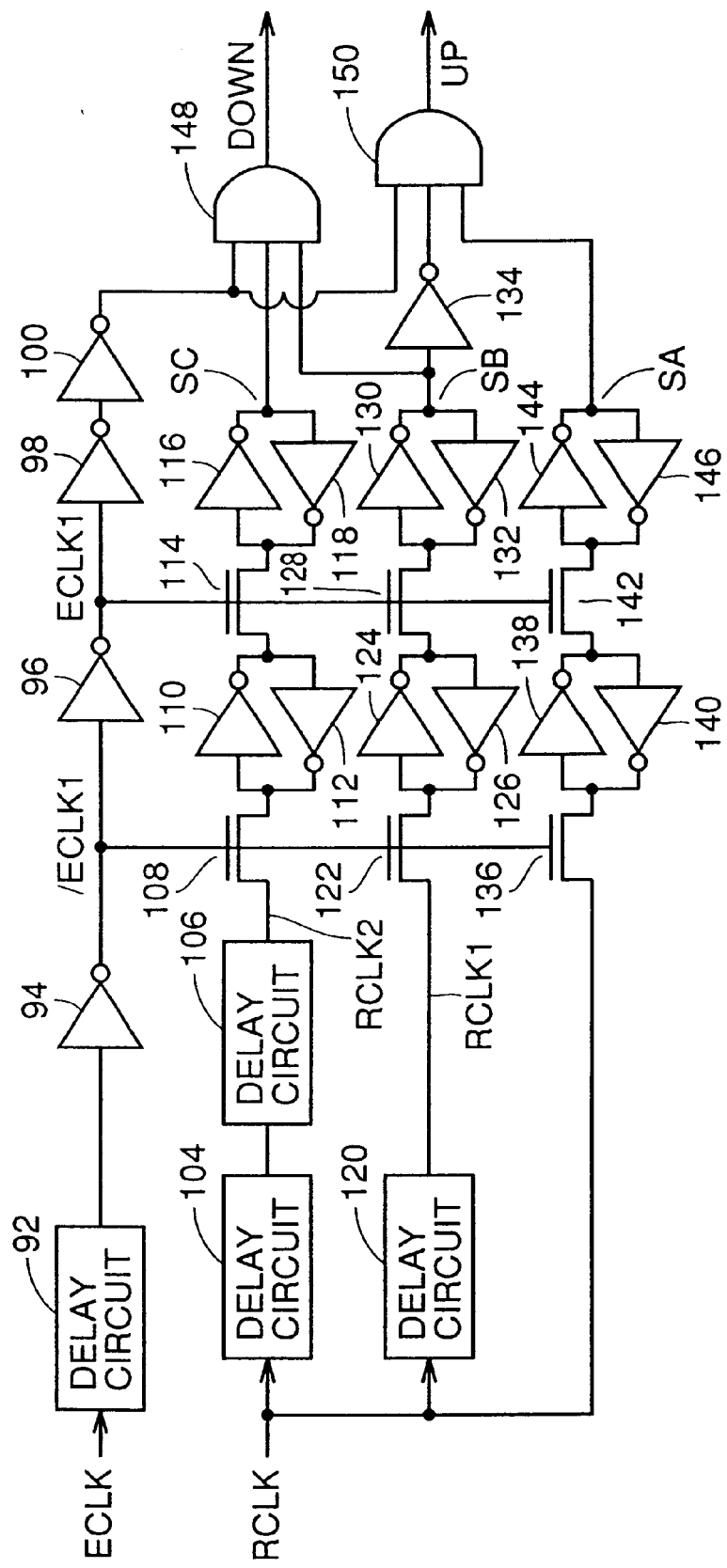
FIG. 6 is a circuit diagram showing a configuration of a phase comparator 28 shown in FIG. 3.

FIG. 6 is a circuit diagram showing a configuration of phase comparator 28 of FIG. 3.

The phase comparator comparing a low to high transition of one signal with that of another signal to determine the signal with a leading phase.

As shown in FIG. 6, phase comparator 28 includes a delay circuit 92 receiving and delaying clock signal ECLK, an inverter 94 receiving and inverting an output of delay circuit 92 to output a clock signal /ECLK, an inverter 96 receiving and inverting clock signal /ECLK1 to output a clock signal ECLK1, and inverters 98 and 100 connected in series receiving clock signal ECLK1.

Phase comparator 28 also includes a delay circuit 104 receiving and delaying a clock signal RCLK, a delay circuit 106 receiving and further delaying an output of delay circuit 104 to output a clock signal RCLK2, an N-channel MOS transistor 108 activated by clock signal /ECLK1, an inverter 110 receiving clock signal RCLK2 via N-channel MOS transistor 108 turned on, and inverting clock signal RCLK2, an inverter 112 receiving, inverting and feeding an output of inverter 110 back to an input of inverter 110, an N-channel MOS transistor 114 activated by clock signal ECLK1, an inverter 116 receiving an output of inverter 110 via N-channel MOS transistor 114 turned on, and inverting the output of inverter 110 to output a signal SC, and an inverter 118 receiving, inverting and feeding signal SC back to an input node of inverter 116.

Phase comparator 28 also includes a delay circuit 120 receiving and delaying clock signal RCLK to output a clock signal RCLK1, an N-channel MOS transistor 122 activated in response to clock signal /ECLK1, an inverter 124 receiving clock signal RCLK1 via N-channel MOS transistor 122 turned on, and inverting clock signal RCLK1, an inverter 126 receiving, inverting and feeding an output of inverter 124 back to an input node of inverter 124, an N-channel MOS transistor 128 activated in response to clock signal ECLK1, an inverter 130 receiving an output of inverter 124 via N-channel MOS transistor 128 turned on, and inverting the output of inverter 124 to output a signal SB, an inverter 132 receiving, inverting and feeding signal SB back to an input node of inverter 130, and an inverter 134 receiving and inverting signal SB.

Phase comparator 28 also includes an N-channel MOS transistor 136 activated in response to clock signal /ECLK1, an inverter 138 receiving clock signal RCLK via N-channel MOS transistor 136 turned on, and inverting clock signal RCLK, an inverter 140 receiving, inverting and feeding an output of inverter 138 back to an input node of inverter 138, an N-channel MOS transistor 142 activated in response to clock signal ECLK1, an inverter 144 receiving an output of inverter 138 via N-channel MOS transistor 142 turned on, and inverting the output of inverter 138 to output a signal SA, and an inverter 146 receiving, inverting and feeding signal SA back to an input node of inverter 144.

Phase comparator 28 also includes a 3-AND circuit 148 receiving an output of inverter 100 and signals SC and SB and outputting control signal DOWN, and a 3-AND circuit 150 receiving an output of inverter 100, an output of inverter 134 and signal SA and outputting control signal UP.

Figure 7:
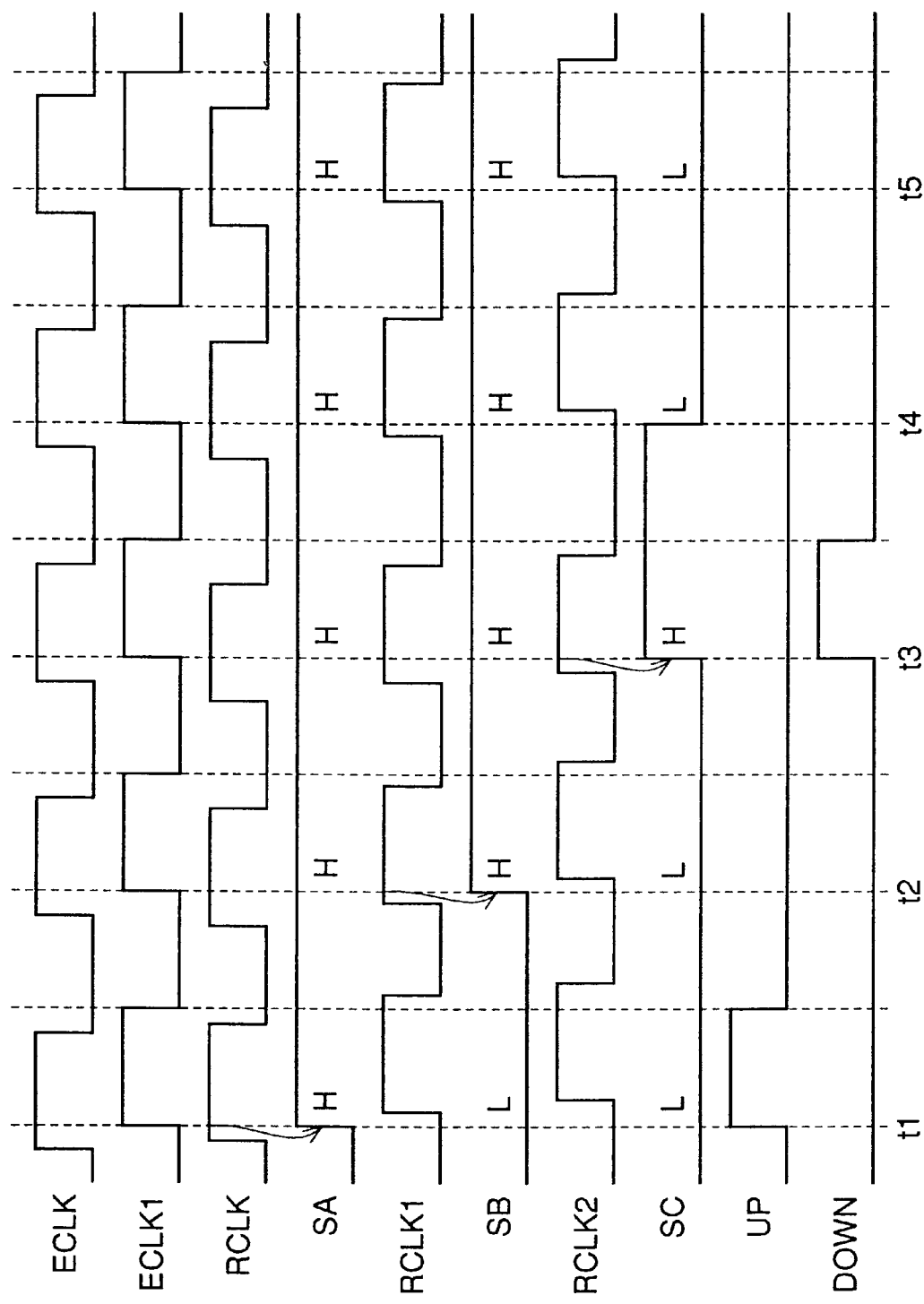
FIG. 7 is a signal waveform diagram for illustrating an operation of phase comparator 28.

FIG. 7 is a waveform diagram for illustrating an operation of phase comparator 28.

As represented in FIGS. 6 and 7, at time t1 N-channel MOS transistors 108, 122 and 136 turn off and N-channel MOS transistors 114, 128 and 142 turn on.

At this time point, clock signal RCLK has a high level and signal SA responsively transitions from low to high. Clock signals RCLK1 and RCLK2 corresponding to clock signal RCLK delayed have a low level and signals SB and SC thus both have a low level.

As such, 3-AND circuit 148 outputs a signal having a low level and control signal DOWN thus has a low level. Furthermore, 3-AND circuit 150 outputs a high level signal for clock signal CLK1 having a high level and control signal UP responsively goes high.

At time t2 clock signal RCLK has a phase advancing relative to that of clock signal RCLK at time t1. Clock signals RCLK and RCLK1 have a high level and clock signal RCLK2, further delayed, has a low level.

At this time point, signals SA and SB have a high level and signal SC has a low level. 3-AND circuits 148 and 150 both outputs a low level signal and control signals DOWN and UP thus both have a low level. Thus, neither control signals DOWN nor UP are activated for clock signal ECLK1 transitioning from low to high between a low to high transition of clock signal RCLK1 and a low to high transition of clock signal RCLK2. Such a dead zone is required to prevent control signals DOWN and UP from being alternately, repeatedly output (so-called chattering).

At time t3, clock signal RCLK has a phase further advancing relative to that of the signal at time t2. Clock signals RCLK, LCLK1 and LCLK2 all have a high level and signals SA, SB and SC all go high. As such, clock signal RCLK has a phase advancing too much relative to clock signal ELCK and signal DOWN is thus activated to increase an amount of delay of the delay line.

At times t4 and t5, as has been described for time t2, clock signal ECLK has its phase in a dead zone and so does clock signal RCLK. As such, neither signals UP nor DOWN are output and the DLL circuit is thus locked.

A description will now be provided of an operation of internal clock generation circuit 10 in the first embodiment of the present invention.

Figure 8:
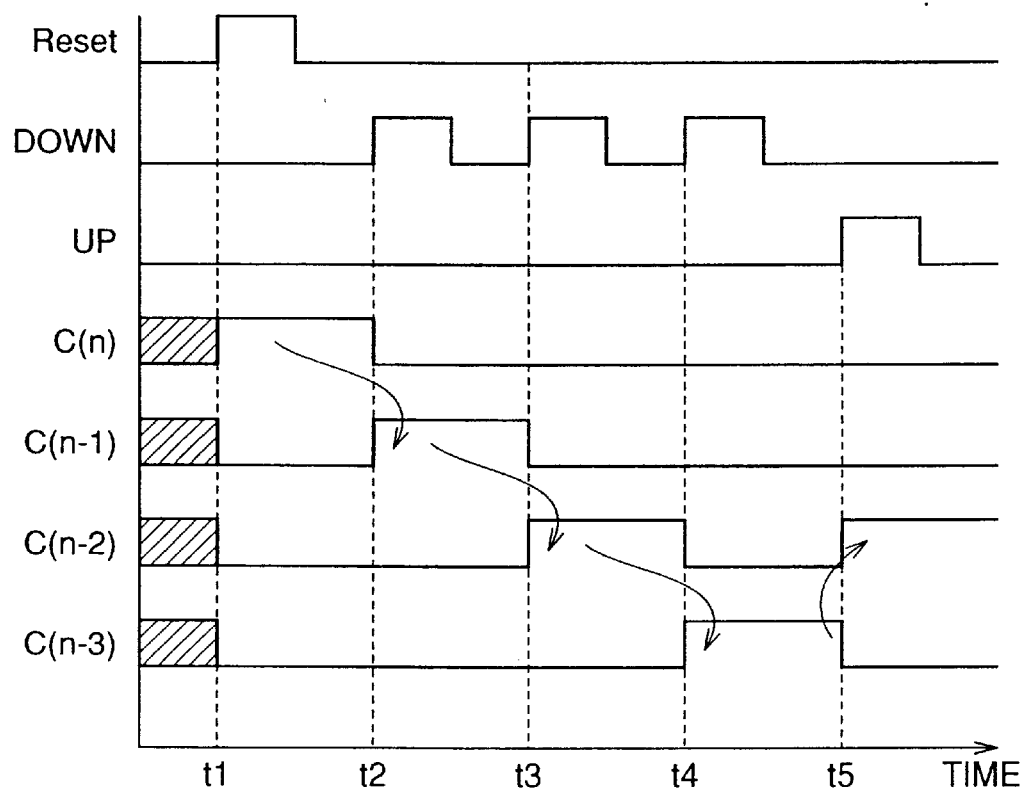

FIG. 8 is a waveform diagram representing a relationship between control signals DOWN and UP output from phase comparator 28 and control signal C output from shift register 24a.

Reference will now be made to FIGS. 5 and 8 to describe a case with shift register 24a increasing a delay time of delay line 22 and that with shift register 24a decreasing a delay time of delay line 22.

Initially, at time t1, upon power-on reset signal Reset is activated, n channel MOS transistors 50#1–50#n turn on and shift registers 52#1–52#n have their respective nodes N3 each set to have an initial value. Responsively, control signals C (1) to C(n−1) are driven low and control signal C(n) goes high. Thus, the FIG. 4 delay line 22 provides a delay time minimized.

Then at time t2 phase comparator 28 compares the phases of clock signals ECLK and RCLK, determines that an amount of delay needs to be increased, and outputs control signal DOWN. Responsively, control signal C(n) is inactivated and control signal C(n−1) is instead activated. Thus, at times t2, t3 and t4, in response to activated control signal DOWN shift register 24a shifts data leftward and responsively control signals C(n−1), C(n−2) and C (n−3) are successively activated.

At time t5, the delay line provides too long a delay time and the phase comparator thus activates control signal UP. Responsively, shift register 24a inactivates control signal C(n−3) and instead activates control signal C(n−2). Thus, control is provided to again reduce a delay time of delay line 22.

Thus, phase comparator 28 provides phase comparison and responsively sends control signals UP and DOWN to shift register 24a to control an amount of delay of delay line 22. This operation is repeated to adjust a phase of internal clock signal ICLK.

As such, in the first embodiment delay line 22 can provide a digitally fine tuned delay time.

It should be noted that the phase comparator is provided with a dead zone determined on the basis of a delay time of a delay circuit. If a high operating frequency is applied and a high level of precision is required for a delay time a dead zone is reduced in width and if a low operating frequency is applied and a high level of precision is not required for a delay time a dead zone is widened in spacing. This can reduce the frequency at which the shift register operates and hence current consumption. As such, changing a sensitivity of a dead zone to accommodate an operating frequency is effective in reducing current consumption. This method can be implemented by increasing a delay time of delay circuits 92, 104, 106 and 120 of the FIG. 6 phase comparator 28 as a clock frequency is lowered. For example, of control signals C(1) to C(n) output from the FIG. 5 shift register 24a, an activated control signal may be monitored and depending on the position at which the signal is activated the phase comparator's delay circuits 92, 94, 106 and 120 may have a delay time increased or decreased.

As has been described above, the first embodiment can provide a semiconductor device including a DLL circuit having delay line 22 providing a delay time adjusted in a step more minutely than conventional. As such, if a fast clock signal is input jitter can be reduced significantly.

Variation of the first Embodiment

Figure 9:
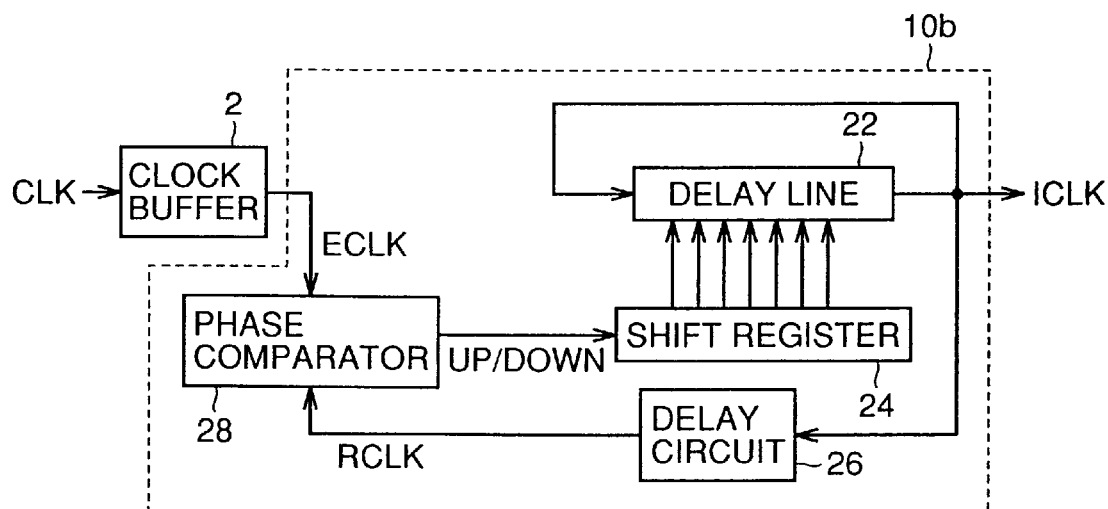
FIG. 9 is a block diagram for illustrating a variation of the first embodiment.

FIG. 9 is a block diagram for illustrating a variation of the first embodiment.

As shown in FIG. 9, the variation of the first embodiment uses a PLL circuit 10b rather than DLL circuit 10a shown in FIG. 3.

PLL circuit 10b has a configuration of the FIG. 3 DLL circuit 10a, although delay line 22 receives and delays internal clock signal ICLK rather than signal ECLK. If delay line 22 has an odd number of stages, internal clock signal ICLK oscillates at a frequency corresponding to a delay time of delay line 22.

Such a PLL can also have the configuration of the FIG. 4 delay line 22 to provide a high level of precision for phase adjustment for a fast clock signal.

SECOND EMBODIMENT

When the power is turned on, with the delay line having its amount of delay set to be minimal, the DLL circuit starts adjusting a delay time, since locking with a large amount of delay would increase jitter. The delay line has an amount of delay varying depending on noise introduced into power supply potential. If the delay line provides a larger amount of delay, depending on the noise the amount of delay has a larger variation. As such in an initial state the delay line has its amount of delay minimized to start delay-time adjustment with an initial amount of delay minimized and lock a phase with the delay line having a possible smallest amount of delay.

Figure 10:
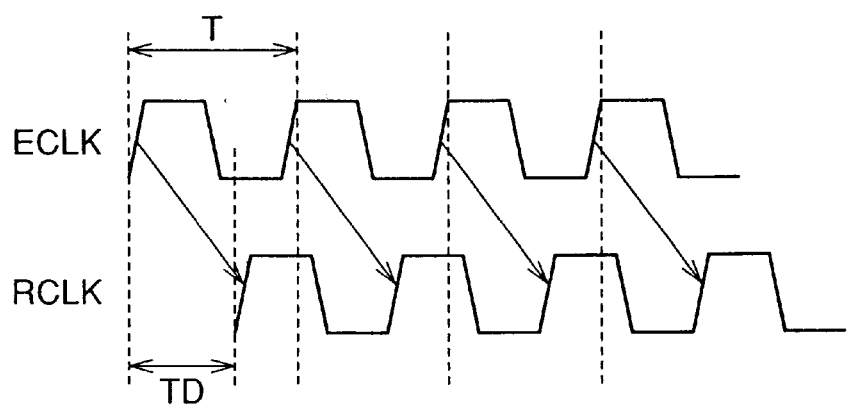
FIGS. 10, 11 and 12 are first, second and third diagrams each for illustrating a relationship between a period of clock and an amount of delay.
Figure 11:
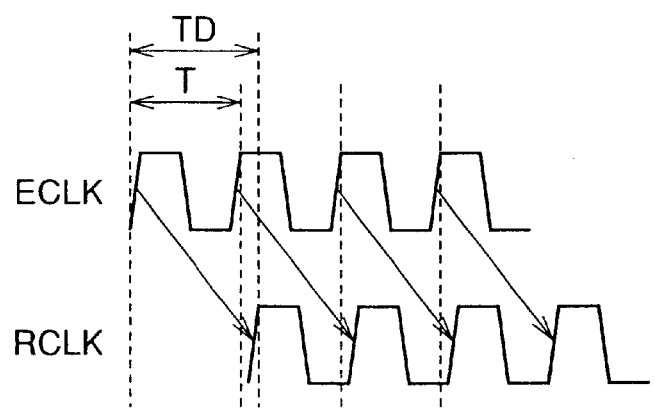
Figure 12:
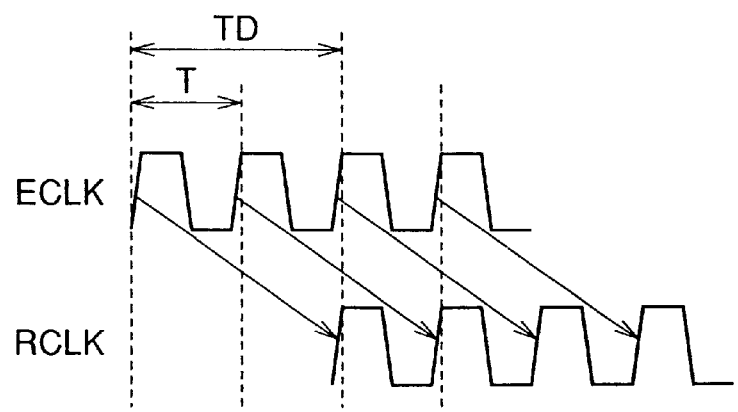

FIGS. 10–12 are diagrams for illustrating a relationship between a clock period and an amount of delay.

As shown in FIG. 10, if a delay time is shorter than a period of an external clock then allowing the delay line to have an amount of delay initially minimized and then gradually increased allows a phase to be locked, with the delay line having a possible shortest internal delay time.

However, if a high operating frequency is applied and the delay line has a delay time longer than the period of the external clock signal, as shown in FIG. 11, it is impossible to lock a phase with the delay line having its current delay time further increased, since the phase comparator attempts to match an edge of signal RCLK with that of signal ECLK closest thereto to maintain stability of operation. As such, in such a condition as shown in FIG. 11, the phase comparator attempts to provide control to reduce a delay time TD. However, since operation is started with the delay line having a minimal delay time, a phase cannot be locked.

This disadvantage may be overcome by starting the operation at power-on with the delay line having a delay time other than minimal and maximal delay times. Thus, a phase can be locked when delay time TD is a multiple of a clock period T, as shown in FIG. 12.

Figure 13:
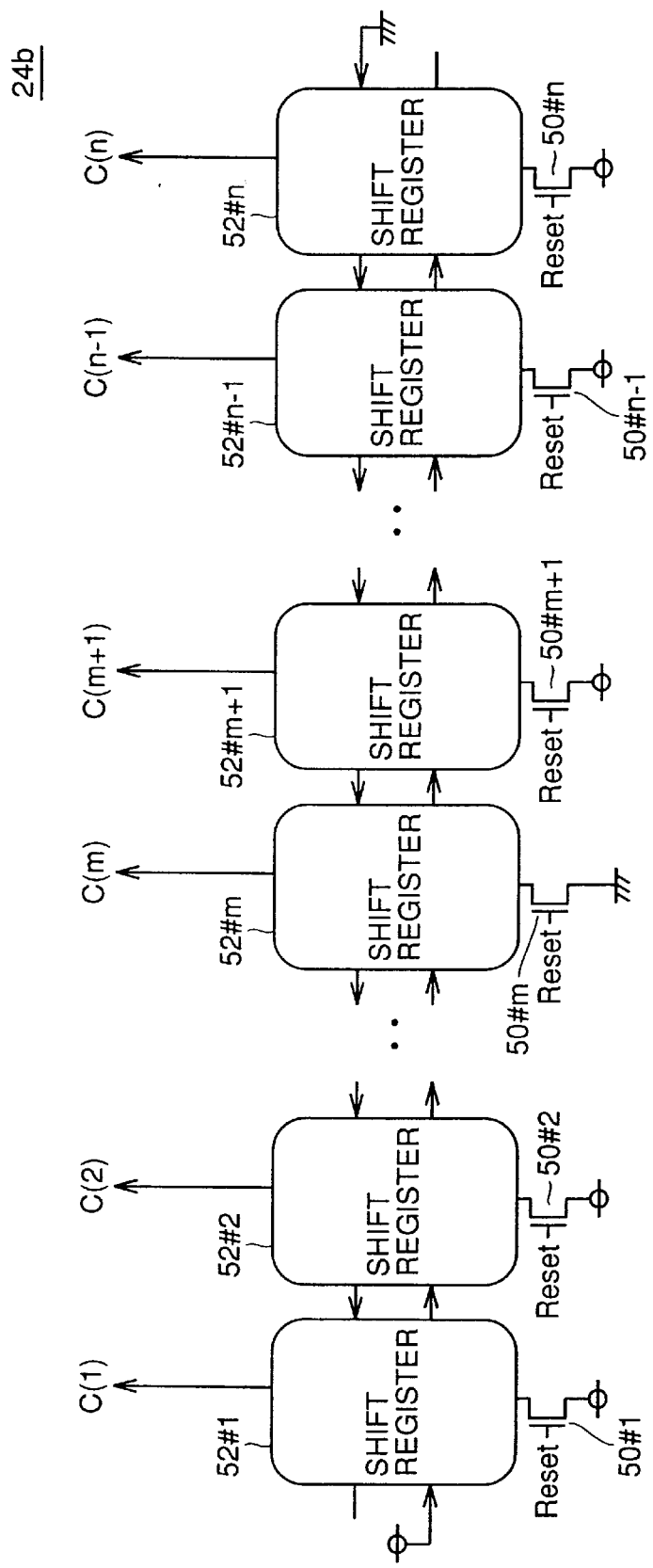
FIG. 13 is a block diagram for illustrating a configuration of a shift register 24b in a second embodiment of the present invention.

FIG. 13 is a block diagram for illustrating a configuration of a shift register 24b in the second embodiment.

As shown in FIG. 13, shift register 24 in the second embodiment has the configuration of the FIG. 5 shift register 24a, except that N-channel MOS transistor 50#n is connected to a power supply node rather than a ground node and an N-channel MOS transistor 50#m applying an initial value to shift register 52#m outputting control signal C(m) with an amount of delay corresponding to an intermediate setting, is instead connected to a ground node. The remainder of the configuration is similar to that of the FIG. 5 shift register 24a and thus will not be described herein.

As such, if a reset signal is used to initialize data, a changing in an initial state of the position of a shift register activating a control signal allows the delay line to have in delay-time adjustment an initial amount of delay other than minimal and maximal amounts of delay. As such, if a high clock frequency is applied an appropriate internal clock can be generated to allow a wider range of clock frequency allowing operation.

Furthermore, the FIG. 9 PLL that employs the FIG. 13 shift register 24b can also accommodate a faster clock signal to allow a wider range of clock frequency allowing operation.

Variation of the Second Embodiment

Whether the delay line should initially have a minimal amount of delay or an intermediate amount of delay depends on operating frequency. As such, the delay line is required to have an initial amount of delay that is switched depending on the type of interest.

Figure 14:
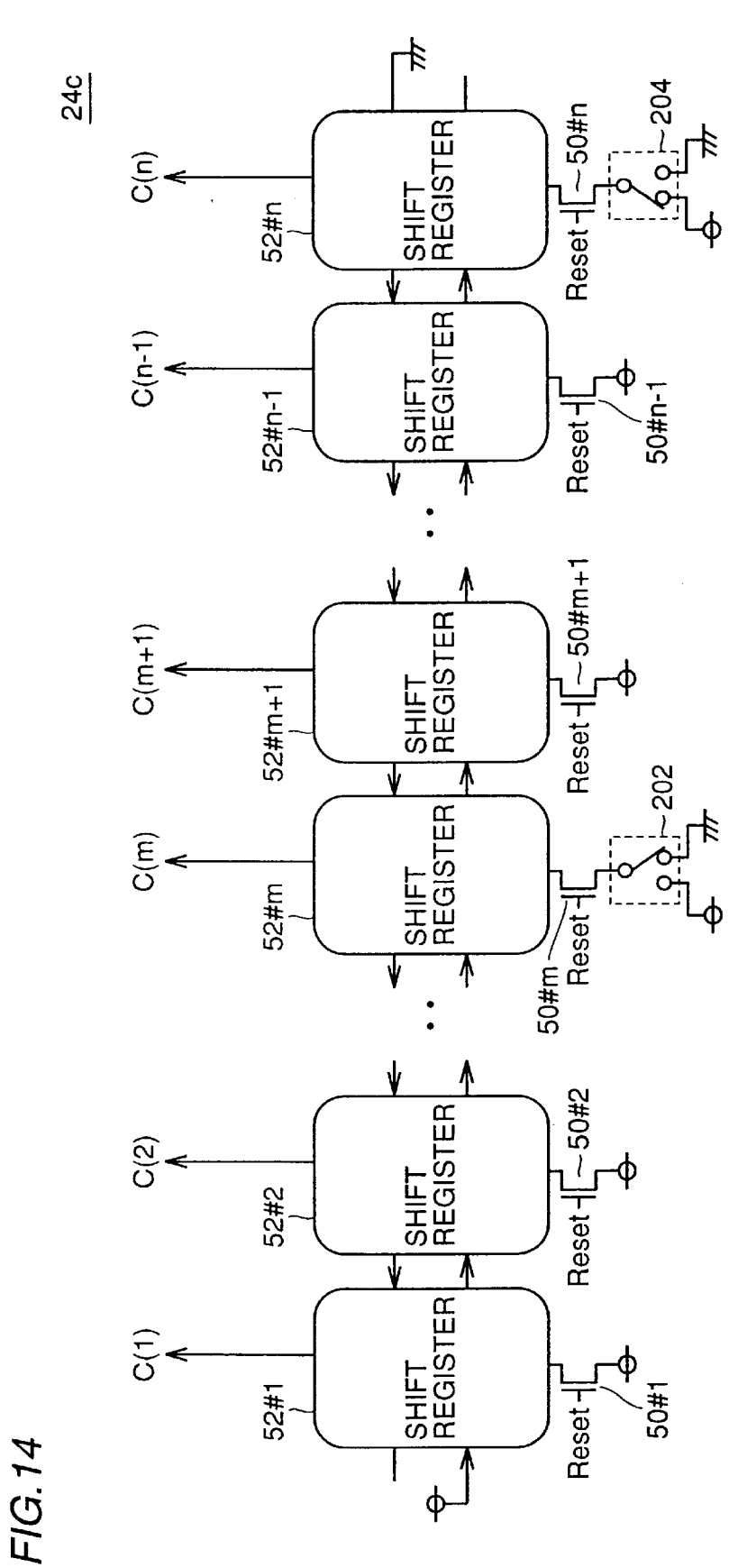
FIG. 14 shows a configuration of a shift register 24c used in a variation of the second embodiment.

FIG. 14 shows a configuration of a shift register 24c for use in a variation of the second embodiment.

As shown in FIG. 14, shift register 24c has the configuration of the FIG. 13 shift register 24b, although the former is different from the latter in that the former includes switches 202, 204 for selectively applying an initial value to N-channel MOS transistors 50#m, 50#n, respectively. The remainder is similar in configuration to shift register 24b and will thus not be described in detail.

Such switching can be more effective if it is provided using a master slice. More specifically, a master slice produced through a common process can be used up to an intermediate step of a wafer processing and in a wiring pattern forming process subsequent thereto a different photomask can be used to produce a switched product.

This switch-over can alternatively be achieved by setting a mode register. A "mode register" herein is the register provided at a portion of the FIG. 1 control circuits 8 capable of setting a mode of operation of an SDRAM.

Figure 15:
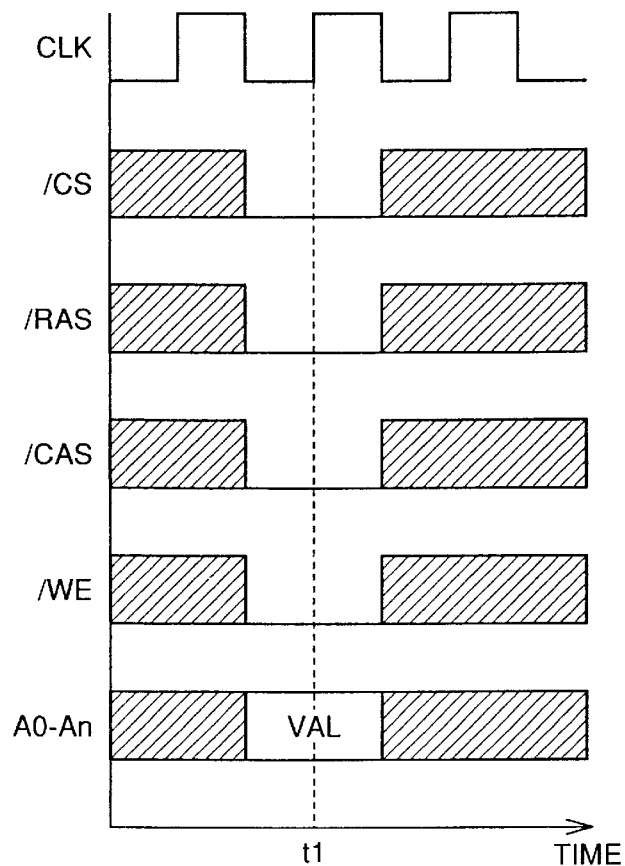
FIG. 15 is a signal waveform diagram for illustrating setting a mode for a mode register.

FIG. 15 is a waveform diagram for illustrating setting a mode via the mode register.

As shown in FIG. 15, when control signals ICS, /RAS, /CAS and /WE are all set low in synchronization with a low to high transition of external clock signal CLK a mode register set command is input and a mode can be set depending on a value VAL corresponding to a combination of the currently applied address signals A0–An.

Figure 16:
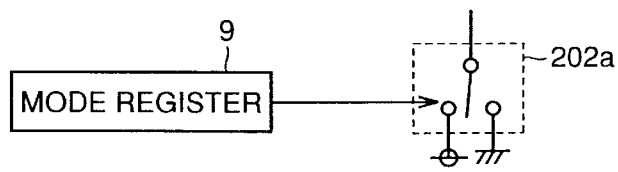
FIG. 16 is a conceptual diagram for illustrating switching an initial value of a shift register in response to an output of a mode register.

FIG. 16 is a conceptual view for illustrating switching an initial value of a shift register depending on an output received from the mode register.

As shown in FIG. 16, in response to a mode register set command mode register 9 outputs a switch signal to a switch 202a. For example, for a high operating frequency switch 202a can be controlled to allow a low level to be applied as an initial value and for a low operating frequency it can be controlled to allow a high level to be applied as an initial value.

A similar effect can also be expected if a shift register has a setting of its initial state that is switched as a CAS latency, which can be normally switched via the mode register, varies.

Furthermore, bonding option can also be employed to switch it for the type of interest.

Figure 17:
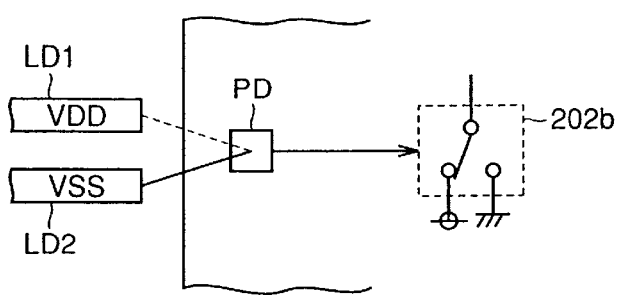
FIG. 17 is a view for illustrating a bonding option.

FIG. 17 is a view for illustrating a bonding option.

As shown in FIG. 17 an SDRAM chip is provided with a pad PD connected to either a lead LD1 receiving a power supply potential VDD of a lead frame or a lead LD2 receiving a ground potential VSS. A switch 202b providing an initial value of a shift register can be switched to provide a high level or a low level depending on a level of potential provided via pad PD. As such, the shift register can have its setting switched between a product ensuring a rapid operation and a product for use with a slow clock.

THIRD EMBODIMENT

While in the first embodiment a description has been provided of a DLL providing an adjustment using a single delay line having an amount of delay uniformly adjusted per step, there may be used a combination of a delay line changing an amount of delay in a fine step and a delay line providing delay varying in a large amount for providing coarse adjustment. Combining such delay lines advantageously allows a delay line to have a reduced number of selectors and the DLL circuit to have a reduced area penalty. However, a process variation and the like can result in the fine-adjustment delay line and the coarse-adjustment delay line having their respective amounts of delay failing to match and thus increasing jitter.

Figure 18:
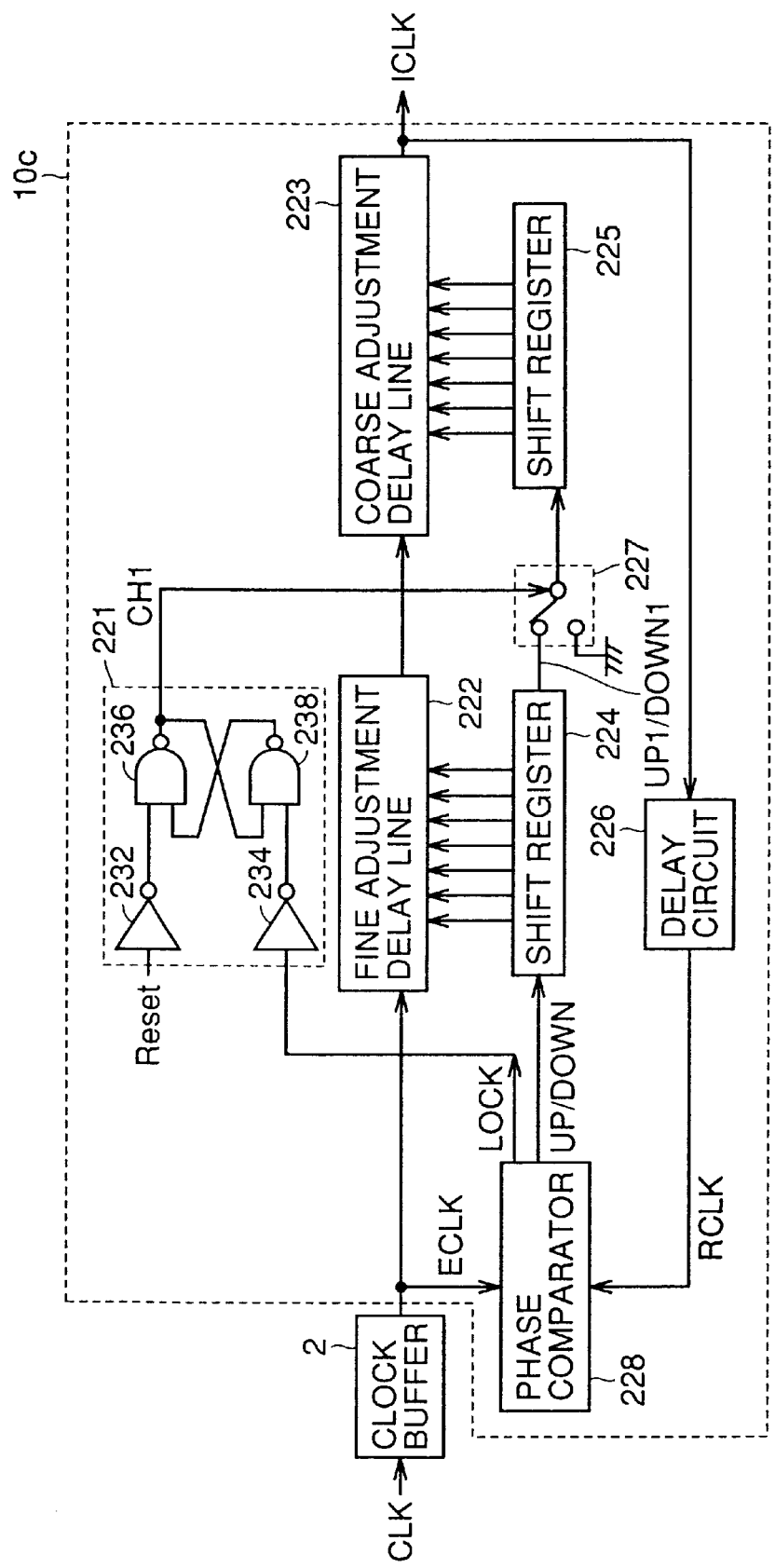
FIG. 18 is a circuit diagram showing a configuration of a DLL circuit 10c used in a third embodiment of the present invention.

FIG. 18 is a circuit diagram showing a configuration of a DLL circuit 10c for use in the third embodiment.

As shown in FIG. 18, DLL circuit 10c receives externally applied clock signal CLK at clock buffer 2 and outputs internal clock signal ICLK.

DLL circuit 10c includes a fine adjustment delay line 222 receiving signal ECLK from clock buffer 2 and delaying signal ECLK, a coarse adjustment delay line 223 receiving an output of fine adjustment delay line 222 and outputting internal clock signal ICLK, a delay circuit 226 delaying internal clock signal ICLK and outputting signal RCLK, and a phase comparator 228 comparing a phase of signal ECLK and that of signal RCLK with each other and outputting control signals UP, DOWN and LOCK.

DLL circuit 10c also includes a shift register 224 responsive to control signals UP and DOWN for adjusting an amount of delay of fine adjustment delay line 222, and a switch control circuit 221 outputting a switch signal CH1 in response to reset signal Reset and control signal LOCK.

Shift register 224, as will be described hereinafter, outputs control signal UP when adjustment exceeding the adjustment range of fine adjustment delay line 222 is required and overflow is caused, and shift register 224 outputs control signal DOWN1 when underflow is caused. When these control signals are output, shift register 224 is internally reset and fine adjustment delay line 222 has its amount of delay returned to an initial state.

DLL circuit 10c also includes a switch circuit 227 responsive to switch signal CH1 for transmitting control signals UP and DOWN or a ground potential, and a shift register 225 responsive to an output of switch circuit 227 for adjusting an amount of delay of coarse adjustment delay line 223.

Shift register 225 is similar in configuration to the FIG. 5 shift register 24a and will thus not be described in detail. Coarse adjustment delay line 223 is also basically similar in configuration to the FIG. 4 delay line 22, adjusted to have a different amount of delay per stage, and will thus not be described in detail.

Switch control circuit 221 includes an inverter 232 receiving and inverting reset signal Reset, an inverter 234 receiving and inverting control signal LOCK, and AND circuits 326, 238 cross-coupled together and having their respective one inputs receiving outputs of inverters 232 and 234, respectively. NAND circuit 236 outputs a signal serving as switch signal CH1.

Figure 19:
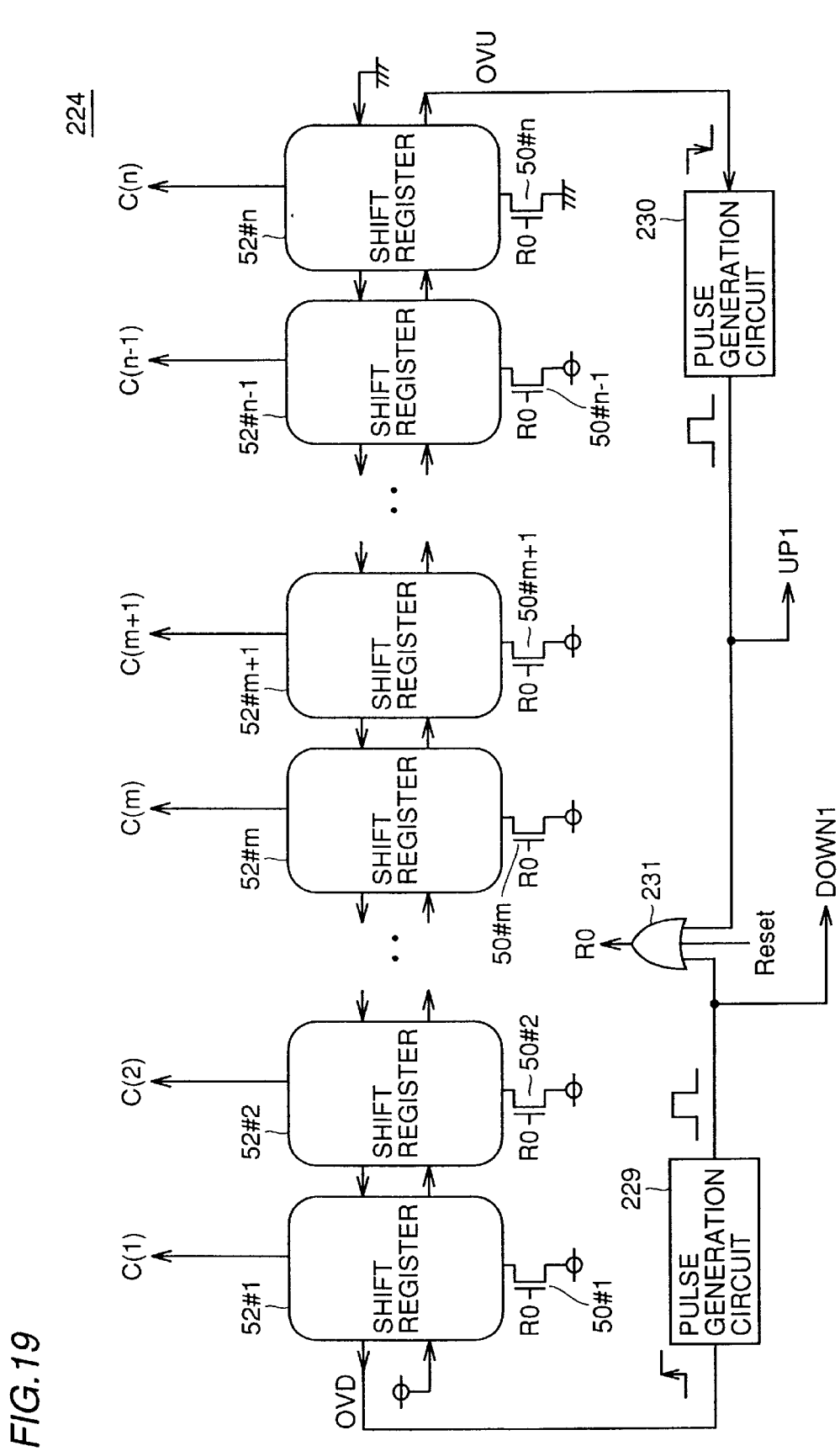
FIG. 19 is a block diagram showing a configuration of a shift register 224 of FIG. 18.

FIG. 19 is a block diagram showing a configuration of shift register 224 shown in FIG. 18.

As shown in FIG. 19, shift register 224 has the configuration of the FIG. 5 shift register 24a plus a pulse generation circuit 229 activating control signal DOWN1 in a pulse in response to a low to high transition of an overflow signal OVD output from shift register 52#1 in response to control signal DOWN being input, a pulse generation circuit 230 activating control signal UP1 in a pulse in response to a high to low transition of an overflow signal OVU output from shift register 52#n in response to control signal UP being input, and an OR circuit receiving control signals DOWN1 and UP1 and reset signal Reset and outputting a reset signal R0.

Furthermore, while in the shift register 24a configuration N-channel MOS transistors 50#1 to 50#n for providing an initial value to shift registers 52#1 to 52#n have their respective gates receiving reset signal Reset, shift register 224 has N-channel MOS transistors 50#1 to 50#n having their respective gates receiving reset signal RO and is thus different in configuration from shift register 24a.

The remainder of shift register 224 is similar in configuration to shift register 24a and will thus not be described in detail.

Figure 20:
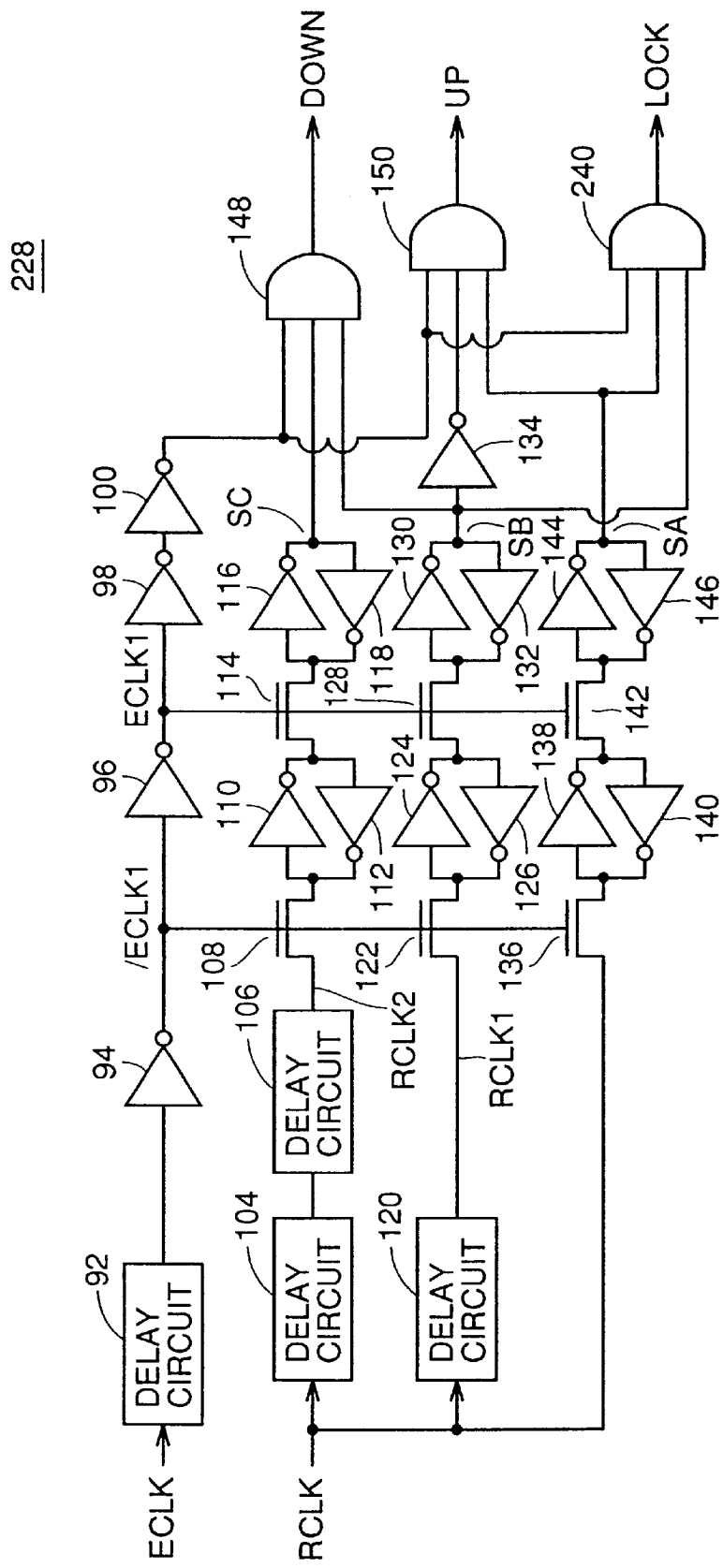
FIG. 20 is a circuit diagram showing a configuration of a phase comparator 228 of FIG. 18.

FIG. 20 is a circuit diagram showing a configuration of phase comparator 228 shown in FIG. 18.

As shown in FIG. 20, phase comparator 228 has the configuration of the FIG. 6 phase comparator 28 except that it further includes a 3-AND circuit 240 receiving an output of inverter 100 and signals SB and SA and outputting control signal LOCK. The remainder of phase comparator 228 is similar in configuration to phase comparator 28 and will thus not be described in detail.

It operates, as will now be briefly described hereinafter. Upon power-on or when a command resetting the DLL circuit is input, switch signal CH1 allows switch circuit 227 to be connected to transmit control signals UP1 and DOWN1 to shift register 225.

When signals ECLK and RCLK have a phase difference therebetween smaller than a predetermined value, phase comparator 228 activates control signal LOCK. Then, switch control circuit 221 changes switch signal CH1. Responsively, switch circuit 227 switches in connection to prevent transmission of control signals UP1 and DOWN1. Then, in a stable state coarse-adjustment delay line 223 has an amount of delay fixed and thereafter only fine-adjustment delay line 222 has an amount of delay varying to adjust a delay time. Thus, jitter in steady state can be significantly reduced.

Figure 21:
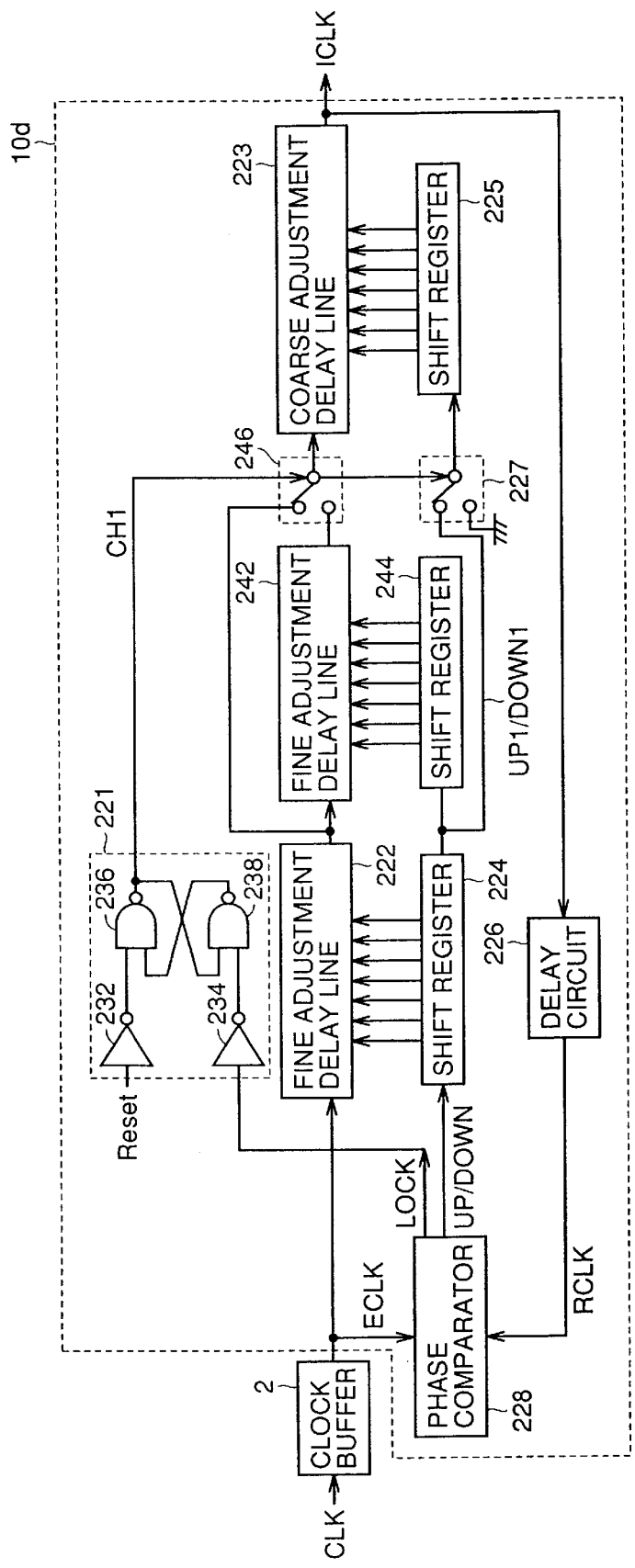
FIG. 21 is a block diagram showing a configuration of a DLL circuit 10d as another exemplary DLL circuit.

FIG. 21 is a block diagram showing a configuration of a DLL circuit 10d corresponding to another exemplary DLL circuit.

As shown in FIG. 21, DLL circuit 10d has the configuration of the FIG. 18 DLL circuit 10c plus a fine adjustment delay line 242, a shift register 244 and a switch circuit 246. Shift register 244 is inserted between the FIG. 18 shift register 224 and switch circuit 227. Fine adjustment delay line 242 receives and further delays an output of fine adjustment delay line 222. Switch circuit 246 transmits either an output of fine adjustment delay line 222 or that of fine adjustment delay line 222 to coarse adjustment delay line 223 in response to switch signal CH1. The remainder is similar in configuration to the FIG. 18 DLL circuit 10c and will thus not be described in detail.

DLL circuit 10d until a locked state is detected adjusts an amount of delay via fine adjustment delay line 222 and coarse adjustment delay line 223. When signals RCLK and ECLK have their phase difference in a predetermined range, the lock state is detected and control signal LOCK is activated, by switch signal CH1 a control input to shift register 225 is fixed and coarse adjustment delay line 223 has an amount of delay fixed. Simultaneously, switch circuit 246 switches in connection to direct an output of fine adjustment delay line 242 to coarse adjustment delay line 223. In such a configuration as above also, allowing coarse adjustment delay line 223 to have an amount of delay fixed when a phase is locked can significantly reduce jitter in steady state.

Figure 22:
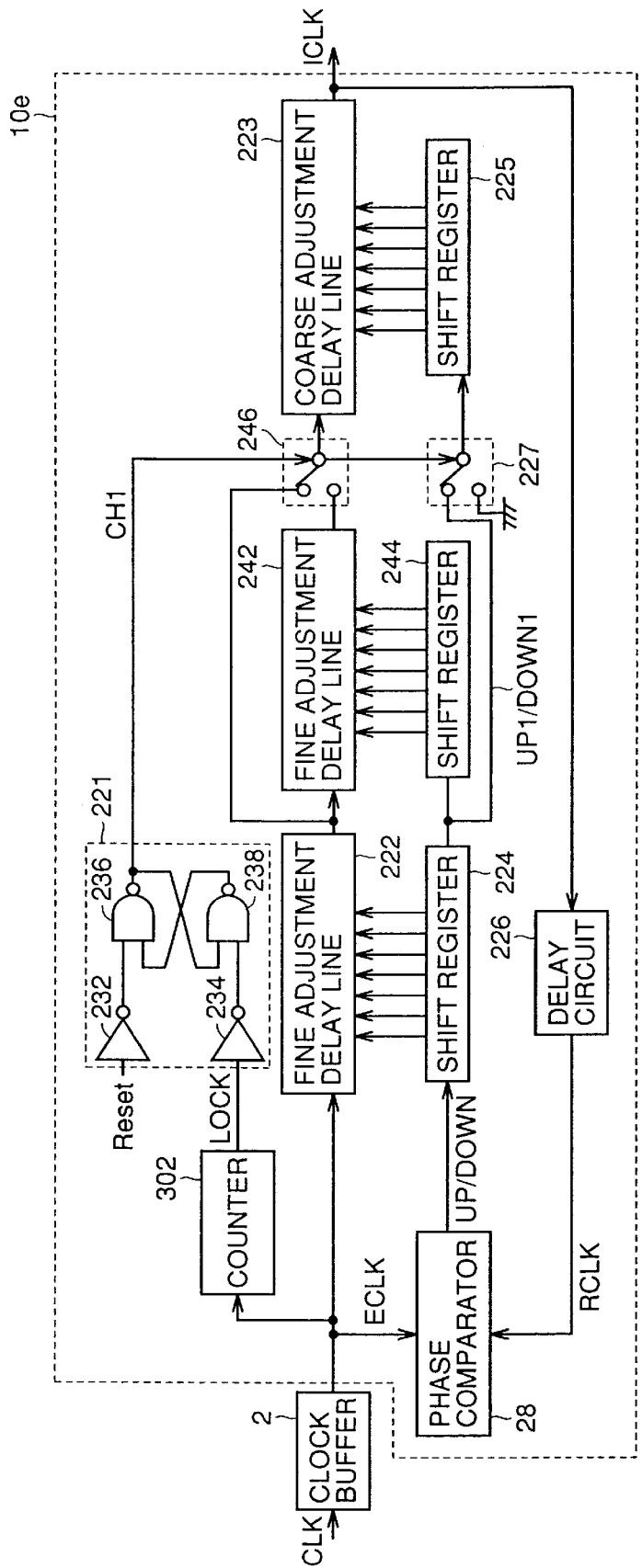
FIG. 22 is a block diagram showing a configuration of a DLL circuit 10e corresponding to another exemplary configuration.

FIG. 22 is a block diagram showing a configuration of a DLL circuit 10e corresponding to another exemplary configuration.

As shown in FIG. 22, DLL circuit 10e has the configuration of the FIG. 21 DLL circuit 10d with phase comparator 228 replaced by the FIG. 6 phase comparator 28, plus a counter 302 counting up signal ECLK and activating control signal LOCK when a predetermined period of time elapses after it starts counting up signal ECLK. The remainder is similar in configuration to DLL circuit 10d and will thus not be described in detail.

More specifically, DLL circuit 10d stops a change when two internal clock signals have a small phase difference therebetween via phase comparator 228, whereas DLL circuit 10e switches a delay line when a clock after power-on or following a reset command is counted and has thus attained a predetermined count. This can also be similarly effective.

Figure 23:
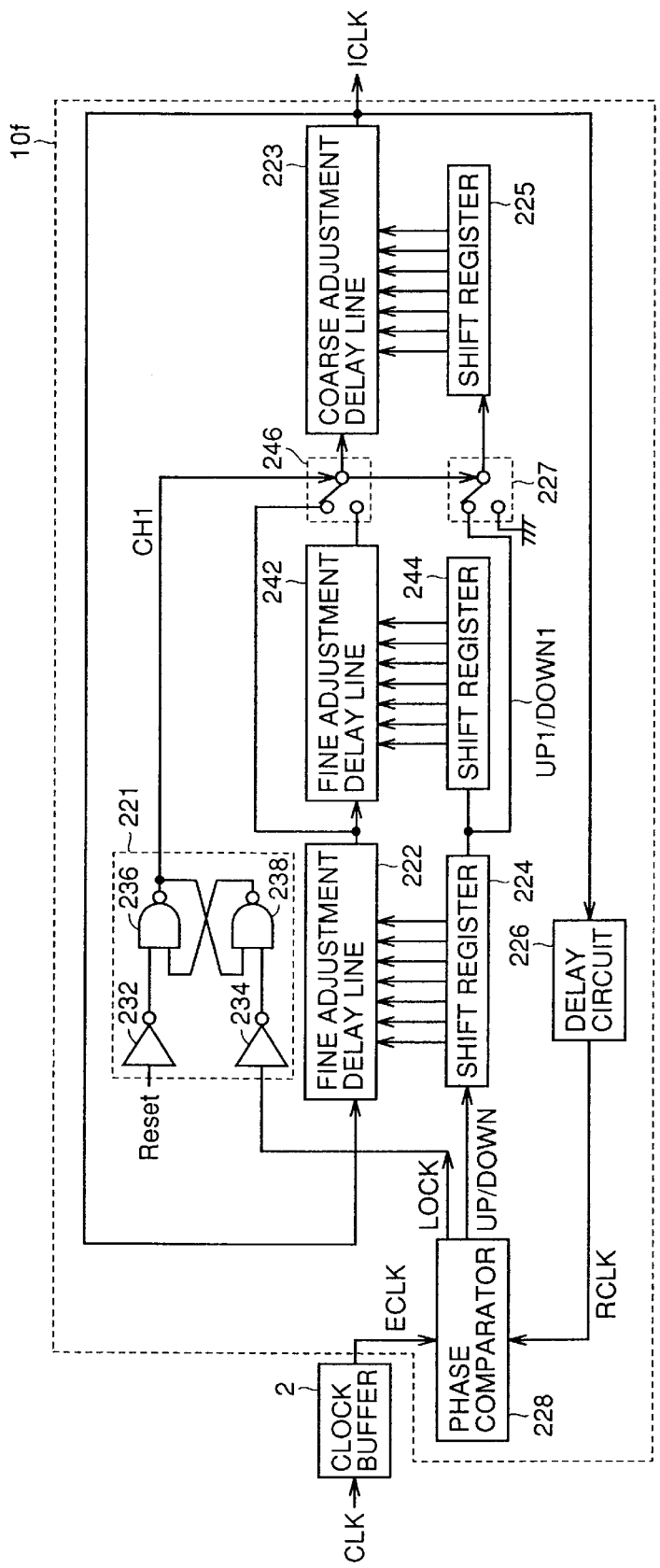
FIG. 23 shows a configuration of a PLL circuit 10f provided to switch a delay line.
Figure 24:
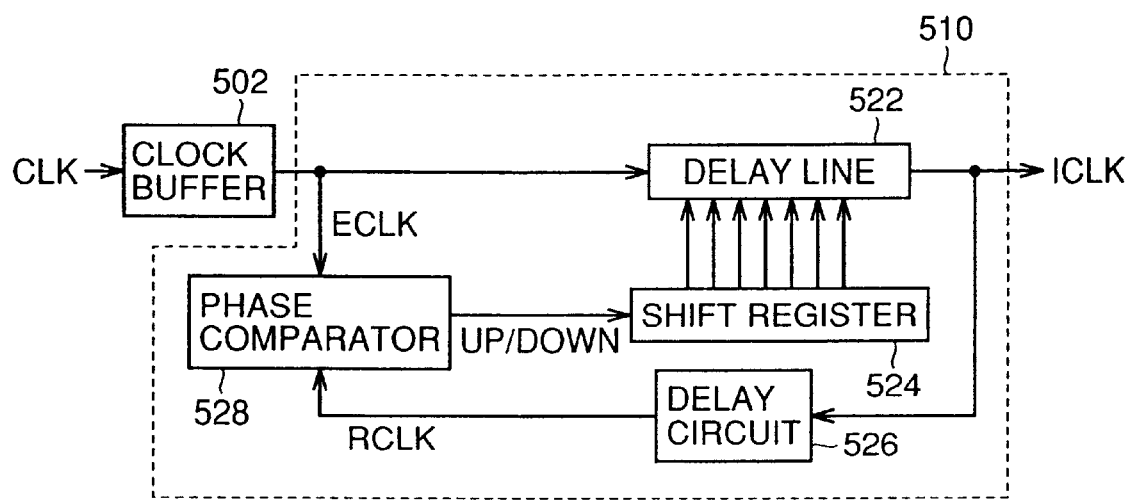
FIG. 24 is a block diagram showing a configuration of a conventional DLL.

FIG. 23 shows a configuration of a PLL circuit 10f switching a delay line.

As shown in FIG. 23, PLL circuit 10f has the configuration of the FIG. 21 DLL circuit 10d, except that fine adjustment delay line 222 receives internal clock signal ICLK rather than signal ECLK. The remainder is similar in configuration to the FIG. 21 DLL circuit 10d and will thus not be described in detail.

As shown in FIG. 23, in the PLL circuit also, when a predetermined period of time elapses, a clock is substantially stabilized and a locked state is detected, coarse adjustment delay line 223 can have a delay time fixed and only fine adjustment delay lines 222 and 242 can be used to provide delay adjustment to reduce jitter in steady state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an internal clock generation circuit generating an operating clock signal in response to an external clock signal, said internal clock generation circuit including
   a phase comparator comparing a phase of said external clock signal and that of said operating clock signal with each other, and
   a clock delay portion responsive to an output of said phase comparator for delaying a first internal clock signal to output said operating clock signal, said clock delay portion having
   a clock conversion portion generating from said first internal clock a second internal signal and a third internal signal complementary to said second internal signal, and
   a clock output portion responsive to the output of said phase comparator for changing by one stage a number of gate stages to be passed through, said clock output portion outputting said operating clock in response to said second internal clock signal when said number of gate stages is an odd number of stages, said clock output portion outputting said operating clock signal in response to said third internal clock signal when said number of gate stages is an even number of stages; and
   an internal circuit operating in response to said operating clock signal.

2. The semiconductor device according to claim 1, wherein:
   said clock delay portion receives said external clock signal as said first internal clock signal; and
   said internal clock generation circuit is a delay-locked loop (DLL) circuit.

3. The semiconductor device according to claim 1, wherein:
   said clock delay portion receives said operating clock signal as said first internal clock signal and oscillates; and
   said internal clock generation circuit is a phase-locked loop (PLL) circuit.

4. The semiconductor device according to claim 1, wherein:

said clock output portion has a plurality of NAND circuits connected in series and corresponding to at least a part of said gate stages, each having a first input node receiving the output of the preceding gate stage and a second input node receiving a fourth internal clock signal corresponding to either one of said second and third internal clock signals, and a selector circuit selecting one of said plurality of NAND circuits and applying said fourth internal clock signal to said second input node of the selected NAND circuit, said selector circuit applying said second internal clock signal as said fourth internal clock signal when said fourth internal clock signal passes through an odd number of stage(s) of said gate stages, said selector circuit applying said third internal clock signal as said fourth internal clock signal when said fourth internal clock signal passes through an even number of stage(s) of said gate stages.

5. A semiconductor device comprising:

an internal clock generation circuit generating an operating clock signal in response to an external clock signal, said internal clock generation circuit including a phase comparator comparing a phase of said external clock signal and a phase of said operating clock signal with each other, and a clock delay portion allowing a delay time to have an initial value set in response to a reset signal, changing said delay time in response to an output of said phase comparator and delaying a first internal clock signal for said delay time to output said operating clock signal, said clock delay portion having a setting switching portion switching said initial value between a first value and a second value increasing said delay time, as compared to said first value, and a clock output portion receiving said initial value from said setting switch portion, changing said delay time in response to the output of said phase comparator and outputting said operating clock signal corresponding to said first internal clock signal delayed; and an internal circuit operating in response to said operating clock signal; wherein:

said clock delay portion receives said operating clock signal as said first internal clock signal and oscillates; and said internal clock generation circuit is a phase-locked loop (PLL) circuit.

6. A semiconductor device comprising:

an internal clock generation circuit generating an operating clock signal in response to an external clock signal, said internal clock generation circuit including a phase comparator comparing a phase of said external clock signal and a phase of said operating clock signal with each other, a first clock delay portion delaying a first internal clock signal for a first delay time determined by an output of said phase comparator, a second clock delay portion delaying an output of said first clock delay portion for a second delay time determined by the output of said phase comparator in a coarser step than said first delay time to output said operating clock, and a control portion instructing said second clock delay portion to fix said second delay time regardless of an output of said phase comparator once said operating clock has achieved a stable state; and an internal circuit operating in response to said operating clock signal.

7. The semiconductor device according to claim 6, wherein said control portion has a latch circuit outputting to said second clock delay portion a control signal corresponding to control data set once said latch circuit has received from said phase comparator a lock signal indicating that said external clock signal and said internal clock signal have therebetween a phase difference-of no more than a predetermined value.

8. The semiconductor device according to claim 6, wherein said control portion has:

a counter detecting said external clock signal being input by a predetermined clock count, as counted since power-on; and a latch circuit set in response to an output of said counter to output a control signal for said second clock delay portion.

9. The semiconductor device according to claim 6; wherein:

said clock drive portion receives said external clock signal as said first internal clock signal; and said internal clock/generation circuit is a delay-locked loop (DLL) circuit.

10. The semiconductor device according to claim 6, wherein:

said clock delay portion receives said operating clock signal as said first internal clock signal and oscillates; and said internal clock generation circuit is a phase-locked loop (PLL) circuit.

\* \* \* \* \*